United States Patent
Xu et al.

(10) Patent No.: US 7,861,131 B1
(45) Date of Patent: Dec. 28, 2010

(54) TENSOR PRODUCT CODES CONTAINING AN ITERATIVE CODE

(75) Inventors: Jun Xu, Milpitas, CA (US); Panu Chaichanavong, Mountain View, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 1205 days.

(21) Appl. No.: 11/449,066

(22) Filed: Jun. 7, 2006

Related U.S. Application Data

(60) Provisional application No. 60/714,125, filed on Sep. 1, 2005.

(51) Int. Cl.
*H03M 13/00* (2006.01)
(52) U.S. Cl. .................. 714/752; 714/753; 714/755
(58) Field of Classification Search ............ 714/752, 714/746, 753, 756, 779, 782, 784, 795, 811
See application file for complete search history.

(56) References Cited

U.S. PATENT DOCUMENTS

| | | | |
|---|---|---|---|
| 4,295,218 A | 10/1981 | Tanner | |
| 4,601,044 A | 7/1986 | Kromer, III et al. | |
| 5,537,444 A | 7/1996 | Nill et al. | |
| 5,757,821 A | 5/1998 | Jamal et al. | |
| 5,926,232 A | 7/1999 | Mangold et al. | |
| 5,930,272 A | 7/1999 | Thesling | |
| 5,933,462 A | 8/1999 | Viterbi et al. | |
| 5,949,831 A | 9/1999 | Coker et al. | |
| 5,974,540 A | 10/1999 | Morikawa et al. | |
| 5,983,385 A | 11/1999 | Khayrallah et al. | |
| 6,002,716 A | 12/1999 | Meyer et al. | |
| 6,009,549 A | 12/1999 | Bliss et al. | |
| 6,021,518 A | 2/2000 | Pelz | |
| 6,023,783 A | 2/2000 | Divsalar et al. | |
| 6,028,728 A | 2/2000 | Reed | |
| 6,081,918 A | 6/2000 | Spielman | |
| 6,145,114 A | 11/2000 | Crozier et al. | |
| 6,161,209 A | 12/2000 | Moher | |
| 6,182,261 B1 | 1/2001 | Haller et al. | |
| 6,219,817 B1 | 4/2001 | Holman | |

(Continued)

FOREIGN PATENT DOCUMENTS

JP 2004164767 6/2004

(Continued)

OTHER PUBLICATIONS

Robert G. Gallager, "Low-Density Parity-Check Codes," Monograph, Cambridge, Mass.: M.I.T. Press, 1963.

(Continued)

*Primary Examiner*—Scott T Baderman
*Assistant Examiner*—Fritz Alphonse

(57) ABSTRACT

Systems and methods are provided for encoding a stream of datawords based on a tensor product code to provide a stream of codewords, and detecting and decoding a stream of received data based on a tensor product code to provide a decoded stream of data. In one aspect, the tensor product code is based on two codes including an inner code and an outer parity hiding code, where the outer parity hiding code is an iterative code. In certain embodiments, the outer parity hiding code is a Turbo code or a low density parity check (LDPC) code.

23 Claims, 15 Drawing Sheets

U.S. PATENT DOCUMENTS

| | | |
|---|---|---|
| 6,427,220 B1 | 7/2002 | Vityaev |
| 6,438,180 B1 | 8/2002 | Kavcic et al. |
| 6,539,367 B1 | 3/2003 | Blanksby et al. |
| 6,581,181 B1 | 6/2003 | Sonu |
| 6,634,007 B1 | 10/2003 | Koetter et al. |
| 6,691,263 B2 | 2/2004 | Vasic et al. |
| 6,708,308 B2 | 3/2004 | De Souza et al. |
| 6,715,121 B1 | 3/2004 | Laurent |
| 6,888,897 B1 | 5/2005 | Nazari et al. |
| 6,965,652 B1 | 11/2005 | Burd et al. |
| 7,000,177 B1 | 2/2006 | Wu et al. |
| 7,031,408 B2 * | 4/2006 | Loeliger et al. ............. 375/341 |
| 7,072,417 B1 | 7/2006 | Burd et al. |
| 7,099,411 B1 | 8/2006 | Wu et al. |
| 7,275,203 B2 * | 9/2007 | Martinez et al. ............ 714/794 |
| 7,277,382 B1 * | 10/2007 | von der Embse ............ 370/209 |
| 2007/0044006 A1 * | 2/2007 | Yang et al. .................. 714/785 |

FOREIGN PATENT DOCUMENTS

| | | |
|---|---|---|
| WO | WO 96/37050 A1 | 11/1996 |
| WO | WO 00/19616 A2 | 4/2004 |

OTHER PUBLICATIONS

Jack K. Wolfe, "On Codes Derivable from the Tensor Product of Check Matrices," *IEEE Transactions on Information Theory*, vol. IT-11, No. 2, pp. 281-284, Apr. 1965.

Joachim Hagenauer and Peter Hoeher, "A Viterbi Algorithm with Soft-Decision Outputs and its Applications," *Global Telecommunications Conference—GLOBECOM '89*, vol. 3, pp. 1680-1686, Nov. 1989.

L.H.C. Lee, "Computation of the Right-Inverse of G(D) and the Left-Inverse of H'(D)," *Electronic Letters*, vol. 26, No. 13, pp. 904-906, Jun. 21, 1990.

Matthew B. Shoemake and Chris Heegard, "Computationally Efficient Turbo Decoding with the Bi-directional Viterbi Algorithm (BIVA)," *Proceedings of the 1997 IEEE International Symposium on Information Theory*, p. 228, 1997.

Andrew J. Viterbi, "An Intuitive Justification and a Simplified Implementation of the MAP Decoder for Convolutional Codes," *IEEE Journal on Selected Areas in Communications*, vol. 16, No. 2., pp. 260-264, Feb. 1998.

David J. C. Mackay, "Good Error-Correcting Codes based on Very Sparse Matrices," *IEEE Transactions on Information Theory*, vol. 45, No. 2, pp. 399-431, Mar. 1999.

Mats Öberg and Paul H. Siegel, "Parity Check Codes for Partial Response Channels," *Global Telecommunications Conference—GLOBECOM '99*, vol. 1b, pp. 717-722, May 1999.

Zi-Ning Wu, "Coding, Iterative Detection and Timing Recovery for Magnetic Recording Channels," Ph.D. Dissertation, Stanford University, Aug. 1999.

Zining Wu, "Coding and Iterative Detection for Magnetic Recording Channels," Boston: Kluwer Academic Publishers, 2000.

Panu Chaichanavong and Paul H. Siegel, "A Tensor-Product Parity Code for Magnetic Recording," *IEEE Transactions on Magnetics*, vol. 42, No. 2, pt. 2, pp. 350-352, Feb. 2006.

* cited by examiner

TENSOR PRODUCT CODES CONTAINING AN ITERATIVE CODE

CROSS-REFERENCE TO RELATED APPLICATIONS

This application claims the benefit under 35 U.S.C. §119 (e) of U.S. Provisional Application No. 60/714,125, filed on Sep. 1, 2005, the contents of which are incorporated by reference herein in their entirety.

BACKGROUND OF THE INVENTION

Embodiments of the invention generally pertain to systems and methods for processing streams of user data for applications including data recording and data communication. In particular, embodiments of the invention pertain to systems and methods for encoding and decoding streams of data.

Linear block codes, such as Single Parity Check (SPC) codes, have found wide-spread application in areas such as magnetic recording and data communications in recent years. Such codes are often used with a Viterbi detector, which provides a coding gain by using a constraint associated with the code to remove certain data sequences from being considered as possible decodings of a received data stream. As used herein, the term "coding gain" refers to a code's ability to lessen the occurrences of errors associated with communication and/or storage of information. The performance of such a detector generally improves when linear block codes with shorter input block lengths are used. However, codes with shorter input block lengths tend to require higher overhead, thus reducing the code rate and resulting in a performance tradeoff of coding gain versus code rate penalty. As used herein, "code rate penalty" refers to a measure (e.g., a ratio) of an amount of user data relative to an amount of extra coding information that is associated with the user data. Extra coding information may be used to detect and/or correct errors that may occur in user data. This extra coding information is commonly referred to as "redundant information/data" or "parity information/data."

Tensor Product Codes (TPC) allow the use of shorter input block lengths without the full code rate penalty typically associated with such block lengths. Accordingly, there is a continued interest in improving the performance of TPC-based encoding and decoding systems.

SUMMARY OF THE INVENTION

Disclosed herein are systems and methods for encoding a stream of datawords based on a tensor product code to provide a stream of codewords, and detecting and decoding a received signal based on a tensor product code to provide a stream of decoded codewords. In one aspect, the tensor product code is based on two codes including an inner code and an outer parity hiding code, where the outer parity hiding code is an iterative code. Generally speaking, iterative codes are codes with associated decoders that iteratively refine estimates of a codeword based at least in part on reliability metrics for previous estimates of the codeword. "Reliability metrics," also known as "soft information," generally refer to numerical quantifications, such as probabilistic quantifications, on a reliability of detection of component bits in a stream of data. In certain embodiments, this is realized by passing the estimates iteratively among one or more decoder elements. In certain embodiments, the outer parity hiding code is a Turbo code or a low density parity check (LDPC) code.

One aspect of the invention includes methods for recovering at least a portion of a stream of received data, wherein the received data is encoded based on a tensor product code that includes an iterative code. The method may include detecting the stream of received data to provide a stream of detected data that corresponds to a codeword of the tensor product code, and decoding the stream of detected data based on at least the iterative code to recover at least a portion of the stream of received data.

Decoding the stream of detected data may include decoding based on the tensor product code. The iterative code may be a turbo code or a low density parity check code. The turbo code may include two systematic convolutional codes.

Detecting the stream of received data may include providing the stream of detected data using a Viterbi detector, a soft output Viterbi algorithm (SOVA) detector, or a Bahl Cocke Jelinek Raviv (BCJR) detector.

Decoding the stream of detected data may further be based on an inner code. The decoding operation can include recovering redundancy data from the stream of detected data based on the inner code, and decoding the redundancy data using the iterative code to provide decoded redundancy data, where the decoded redundancy data corresponds to a codeword of the outer parity hiding code.

Decoding the stream of detected data may further include re-detecting the stream of received data based on the decoded redundancy data to provide decoded data, where the decoded data corresponds to a codeword of the tensor product code. Re-detecting the stream of received data may include detecting the stream of received data based on a Viterbi detector and the decoded redundancy data, where the decoded redundancy data constrains outputs of the Viterbi detector.

Providing at least one reliability metric for the stream of detected data may be based on the stream of received data. Providing at least one reliability metric for the redundancy data may be based on the at least one reliability metric for the stream of detected data. The at least one reliability metric for the redundancy data may include at least one of likelihood information and log likelihood information. The method may also include decoding the at least a portion of the stream of received data based on a second run length limited decoder to provide a first stream of data, including dummy bits in the first stream of data to provide a second stream of data, decoding the second stream of data based on an error correction code decoder to provide a third stream of data, removing the dummy bits from the third stream of data to provide a fourth stream of data, and decoding the fourth stream of data based on a first run length limited decoder.

One aspect of the invention may include a method for providing encoded data, including receiving data to be encoded, and encoding the data based on a tensor product code that includes an iterative code to provide encoded data. The iterative code may be a turbo code or a low density parity check code. The turbo code can include two systematic codes. The encoded data can be further encoded based on an error correction code or a run length limited code. The error correction encoding or run length limited encoding can occur before encoding based on the tensor product code or after encoding based on the tensor product code. The method may include encoding the data based on a first run length limited code to provide a first stream of data, including dummy bits in the first stream of data to provide a second stream of data, generating redundancy data for the second stream of data based on an error correction code, encoding the redundancy data for the second stream of data based on a second run length limited encoder to provide a third stream of data, and encoding a combination of the second stream of data and the third stream of data based on the tensor product code.

One aspect of the invention includes systems for recovering at least a portion of a stream of received data, wherein the stream of received data is encoded based on a tensor product code (TPC) that includes an iterative code. The system can include a detector that detects the stream of received data to provide a stream of detected data, where the detected data corresponds to a codeword of the tensor product code. The system can further include a TPC decoder in communication with the detector, where the TPC decoder decodes the stream of detected data based on at least the iterative code.

In one embodiment, the iterative code may be a low density parity check code, and the TPC decoder may include a low density parity check decoder corresponding to the low density parity check code. In one embodiment, the iterative code may be a Turbo code, and the TPC decoder may include a Turbo decoder corresponding to the Turbo code. The turbo decoder may include two systematic convolutional decoders.

The TPC decoder may include an inner code encoder in communication with the detector, where the inner code encoder encodes the stream of detected data based on an inner code to provide redundancy data, where the redundancy data corresponds to a codeword of the iterative code. The TPC decoder may also include an iterative decoder corresponding to the iterative code and in communication with the inner code encoder, where the iterative decoder decodes the redundancy data using the iterative code to provide decoded redundancy data, where the decoded redundancy data correspond to codewords of the iterative code.

The TPC decoder may re-detect the stream of received data based on the decoded redundancy data. The decoder may constrain outputs of a Viterbi detector based on the decoded redundancy data to re-detect the stream of received data.

The detector may provide the stream of detected data using at least one of a Viterbi detector, a soft output Viterbi algorithm (SOVA) detector, and a Bahl Cocke Jelinek Raviv (BCJR) detector.

The detector may provide one or more reliability metric for the stream of detected data based on the stream of received data. The decoder may provide one or more reliability metric for the redundancy data based on the reliability metrics for the stream of detected data. The at least one reliability metric for the redundancy data may include one or more of likelihood information and log likelihood information.

The systems may also include an error correcting decoder or a run length limited decoder. The error correcting decoding or the run length limited decoding can occur before or after decoding based on the tensor product code. In certain implementations, the system includes a second run length limited decoder in communication with the TPC decoder that decodes the at least a portion of the stream of received data to provide a first stream of data, a dummy bit marker in communication with the second run length limited decoder that includes dummy bits in the first stream of data to provide a second stream of data, an error correction code decoder in communication with the zero marker that decodes the second stream of data to provide a third stream of data, a dummy bit remover in communication with the error correction decoder that removes the dummy bits from the third stream of data to provide a fourth stream of data, and a first run length limited decoder in communication with the dummy bit remover that decodes the fourth stream of data.

The invention may include an encoder that encodes based on a tensor product code that includes an iterative code. The iterative code may be one of a turbo code and a low density parity check code. The turbo code may include two systematic codes. The encoder may further include at least one of an error correction encoder and a run length limited encoder. The system may include a first run length limited encoder that encodes the data to provide a first stream of data, a dummy bit padder in communication with the first run length limited encode that includes dummy bits in the first stream of data to provide a second stream of data, an error correction code encoder in communication with the dummy bit padder that generates redundancy data for the second stream of data, a second run length limited encoder in communication with the error correction code encoder that encodes the redundancy data for the second stream of data to provide a third stream of data, and a concatenator in communication with the second run length limited encoder and the TPC encoder that provides a combination of the second stream of data and the third stream of data to the TPC encoder.

One aspect of the invention may include a system for recovering at least a portion of a stream of received data, where the stream of received data is encoded based on a tensor product code (TPC) that includes an iterative code. The system may include detecting means for detecting the stream of received data to provide a stream of detected data, where the detected data correspond to a codeword of the tensor product code, and decoding means for decoding the stream of detected data based on at least the iterative code.

The iterative code may be a low density parity check code, and there may be included means for low density parity check decoding corresponding to the low density parity check code. The iterative code may be a Turbo code, and there may be included means for Turbo decoding corresponding to the Turbo code. The means for turbo decoding may include means for systematic convolutional decodings.

One aspect of the invention may include inner code encoding means for encoding the stream of detected data based on an inner code to provide redundancy data, where the redundancy data corresponds to a codeword of the iterative code, and iterative code decoding means for decoding the redundancy data using the iterative code to provide decoded redundancy data, where the decoded redundancy data correspond to codewords of the outer parity hiding code.

There may be detection means for re-detecting the stream of received data based on the decoded redundancy data. The detection means may be means for performing Viterbi detection, where the outputs of the Viterbi detection can be constrained based on the decoded redundancy data. The detection means may be means for performing Viterbi detection, soft output Viterbi detection, or Bahl Cocke Jelinek Raviv (BCJR) detection.

There may be means for providing one or more reliability metrics for the stream of detected data based on the stream of received data. There may be means for providing one or more reliability metrics for the redundancy data based on the reliability metrics for the stream of detected data. The at least one reliability metric for the redundancy data may include at least one of likelihood information and log likelihood information.

In one embodiment, the disclosed systems may include means for error correction code decoding and means for run length limited decoding. The systems may include means for decoding the at least a portion of the stream of received data based on a second run length limited decoder to provide a first stream of data, means for including dummy bits in the first stream of data to provide a second stream of data, means for decoding the second stream of data based on an error correction code decoder to provide a third stream of data, means for removing the dummy bits from the third stream of data to provide a fourth stream of data, and means for decoding the fourth stream of data based on a first run length limited decoder.

The invention may include means for encoding data, comprising means for encoding based on a tensor product code that includes an iterative code. The iterative code may be one of a turbo code and a low density parity check code. The turbo code may include two systematic codes. There may be means for at least one of an error correction encoding and a run length limited encoding. The systems may include means for encoding the data based on a first run length limited code to provide a first stream of data, means for including dummy bits in the first stream of data to provide a second stream of data, means for generating redundancy data for the second stream of data based on an error correction code, means for encoding the redundancy data for the second stream of data based on a second run length limited encoder to provide a third stream of data, and means for encoding a combination of the second stream of data and the third stream of data based on the tensor product code.

One aspect of the invention may include a computer program comprising instructions for execution on a computer to recover at least a portion of a stream of received data, where the received data is encoded based on a tensor product code that includes an iterative code, including instructions for detecting the stream of received data to provide a stream of detected data, where the detected data corresponds to a codeword of the tensor product code, and instructions for decoding the stream of detected data based on the iterative code to recover at least a portion of the stream of received data.

The program may include instructions for decoding the stream of detected data includes decoding based on the tensor product code. The iterative code may be one of a turbo code and a low density parity check code. The turbo code may include two systematic convolutional codes. The program may include instructions for detecting the stream of received data and providing the stream of detected data using one of a Viterbi detector, a soft output Viterbi algorithm (SOVA) detector, and a Bahl Cocke Jelinek Raviv (BCJR) detector.

The program may include instructions for decoding the stream of detected data based on an inner code, the decoding instructions including instructions for recovering redundancy data from the stream of detected data based on the inner code, and instructions for decoding the redundancy data using the iterative code to provide decoded redundancy data.

The instructions for decoding the stream of detected data may further comprise instructions for re-detecting the stream of received data based on the decoded redundancy data to provide decoded data. The instructions for re-detecting the stream of received data may comprise instructions for detecting the stream of received data based on Viterbi detection and the decoded redundancy data, wherein the instructions constrain outputs of the Viterbi detection based on the decoded redundancy data.

The program may include instructions for providing at least one reliability metric for the stream of detected data based on the stream of received data. The program may include instructions for providing at least one reliability metric for the redundancy data based on the at least one reliability metric for the stream of detected data. The at least one reliability metric for the redundancy data may include at least one of likelihood information and log likelihood information. The program may include instructions for decoding the at least a portion of the stream of received data based on a second run length limited decoder to provide a first stream of data, instructions for including dummy bits in the first stream of data to provide a second stream of data, instructions for decoding the second stream of data based on an error correction code decoder to provide a third stream of data, instructions for removing the dummy bits from the third stream of data to provide a fourth stream of data, and instructions for decoding the fourth stream of data based on a first run length limited decoder.

This invention may include a computer program comprising instructions for execution on a computer to encode data based on a tensor product code that includes an iterative code. The iterative code may be one of a turbo code and a low density parity check code. The turbo code may include two systematic convolutional codes. The program may include instructions for encoding the data based on at least one of an error correction code and a run length limited code. The program may include instructions for encoding the data based on a first run length limited code to provide a first stream of data, instructions for including dummy bits in the first stream of data to provide a second stream of data, instructions for generating redundancy data for the second stream of data based on an error correction code, instructions for encoding the redundancy data for the second stream of data based on a second run length limited encoder to provide a third stream of data, and instructions for encoding a combination of the second stream of data and the third stream of data based on the tensor product code.

Further features of the invention, its nature and various advantages, will be more apparent from the accompanying drawings and the following detailed description of the various embodiments.

DETAILED DESCRIPTION

The systems and methods of this invention generally relate to detecting and/or correcting errors associated with the communication and/or storage of data. In general, and as will be discussed in more detail below, a "channel" refers to a medium on which a data-bearing signal is communicated and/or stored, as well as events that may physically affect the medium. Because various aspect of a channel may corrupt data that is communicated or stored thereon, the data recovered subsequent to communication or storage may be different from their intended values; such differences are referred to herein as "errors." The systems and methods described herein employ data encoding and decoding to mitigate the occurrences of errors in data. "Encoding" generally refers to the process of generating data in a manner that facilitates subsequent detection and/or correction of errors in the data, and "decoding" generally refers to the counterpart process of detecting and/or correcting the errors.

Figure 1:
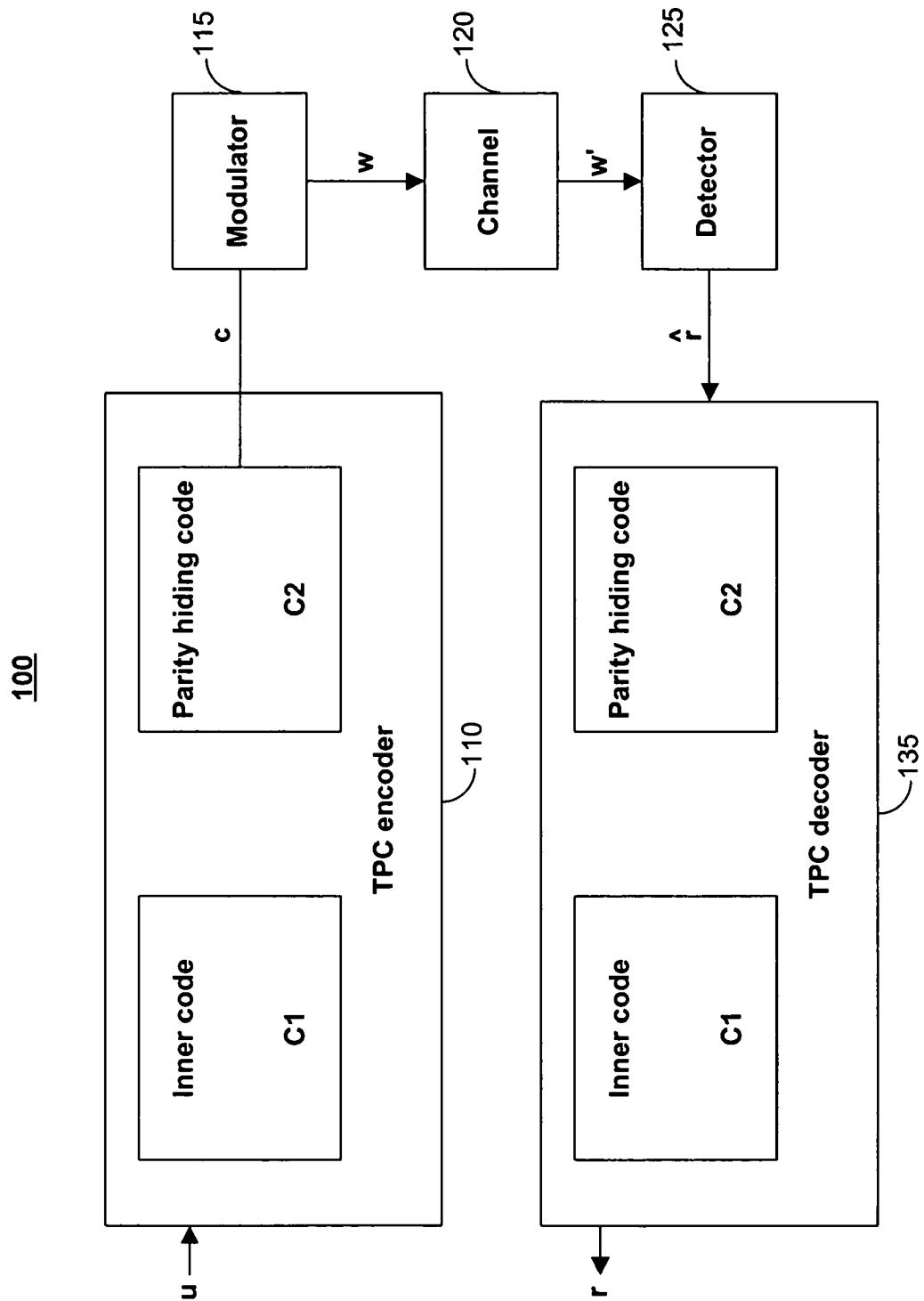
FIG. 1 is a block diagram of an exemplary system in accordance with one aspect of the invention.

This functionality is realized, in one embodiment, by the data storage/communication system 100 illustrated by a block diagram in FIG. 1. Generally, and as will be described in more detail below, the system 100 includes a stream of datawords u that is encoded by a TPC encoder 110 to provide a stream of codewords c. A "dataword," as used herein, refers to a group of binary digits, or bits, suitable for input to an encoder, such as TPC encoder 110. A "codeword" refers to a group of bits generated by an encoder based on an input dataword. A "binary word" refers more generically to a group of binary digits, and may be, for example, a dataword or a codeword. The constituent bits of the stream of datawords u are also referred to herein as "user bits/data." Also shown in FIG. 1 is a modulator 115. A "modulator," as used herein, refers to a device which provides a communication/storage signal, such as a signal w, based on binary data, such as the stream of codewords c. The signal w is communicated and/or stored on the channel 120. The channel 120 provides a received signal w' which, as mentioned above, may be a corrupted version of the transmitted signal w. The detector 125 demodulates the received signal w' and provides an initial estimate r̂ of the stream of codewords c based on the received signal w'. Finally, the system 100 includes a TPC decoder 135 that attempts to recover the stream of codewords c by detecting and/or correcting any errors in the initial estimate r̂.

In particular, and with continued reference to FIG. 1, the stream of datawords u may be provided by an application for communication and/or storage of data so that it can be recovered at another time and/or place. By way of example, the stream of datawords u may include data for storage on a magnetic recording medium, or data for communication over a communications medium. The stream of datawords u, as mentioned above, is generally provided in the form of a stream of binary digits, or bits (i.e., a stream of 1's and 0's). However, in the case where the stream of datawords u is provided in another form, other preprocessing components (not shown) may encode the data into a stream of bits. The stream of datawords u may be associated with a variety of sources of data, including, by way of example, text, audio, image, and/or video data.

The TPC encoder 110 encodes the stream of datawords u to provide a stream of codewords c that will be communicated and/or stored on the channel 120. The TPC encoder 110 generates the stream of codewords c in a manner that facilitates subsequent recovery of the stream of datawords u. For example, the codewords c may facilitate detection and/or correction of errors caused by the transmission of the stream of codewords c over channel 120. The TPC encoder 110 encodes datawords u based on two codes, including an inner code labeled C1, and an outer parity hiding code labeled C2. The TPC encoder 110 will be discussed in more detail with respect to FIG. 2.

The stream of codewords c are modulated by a modulator 115 to provide a communication signal w. As mentioned above, the modulator 115 represents a device which provides a communication/storage signal, such as transmitted signal w, that is suitable for delivery on channel 120. For example, in certain embodiments modulator 115 is a device which manipulates the frequency, amplitude, and/or phase of a transmitted electromagnetic signal based on the stream of codewords c. In other embodiments, the modulator 115 is a device which stores the stream of codewords c onto a magnetic storage medium.

Channel 120 represents a medium on which the transmitted signal w is transmitted and/or stored. In certain embodiments, channel 120 corresponds to a storage medium, such as a magnetic storage medium (e.g., a hard drive), an optical storage medium (e.g., a CD), or an electrical storage medium (e.g., random access memory). For example, the channel 120 can correspond to a read path of a disk drive, including a magnetic storage medium, disk-drive read head, and other devices. In other embodiments, channel 120 corresponds to a signal-bearing communication channel. Channel 120 may also represent events associated with the medium. For example, channel 120 may represent an occurrence of physical damage to the storage medium and/or signal bearing communication channel. From this point on, for ease of explanation, channel 120 will be referred to herein in the context of a communication channel 120 over which a data-bearing signal is transmitted. However, the disclosed technology contemplates that channel 120 may represent mediums and/or events other than a communication channel and other than those mentioned herein.

As discussed above, channel 120 may corrupt the transmitted signal w, and thus provide a received signal w' that may be different from the transmitted signal w.

The source of data corruption, sometimes referred to as "noise," can include interference sources that may be external and/or internal to the channel 120. By way of example, the source of data corruption may include other interfering communications signals, or physical corruption to a magnetic storage medium or read devices associated therewith.

Detector 125 provides an initial estimate of the stream of codewords c based on the received signal w'. The initial estimate is provided in the form of a stream of detected codewords r̂. As will be described herein in connection with FIG. 3A, the detector 125 may also provide reliability metrics (not shown in FIG. 1). As used herein, "reliability metrics" refer to numerical quantifications, such as probabilistic quantifications, that indicate the reliability or confidence in the value of a detected or decoded codeword, such as the detected codewords r̂. Reliability metrics are also commonly referred to as "soft information." TPC decoder 135 provides the stream of decoded codewords r based on the stream of detected codewords r̂ and the reliability metrics (not shown in FIG. 1). If the TPC decoding is successful, the stream of decoded codewords r will be the same as the stream of codewords c. Then, the stream of decoded codewords r can be used to recover the original datawords u.

In addition to the functional blocks illustrated in FIG. 1, embodiments of this invention may include other components. For example, the stream of datawords u may be encoded by one or both of a Reed Solomon error correcting code (RS-ECC) and a run-length limited (RLL) code before being encoded by the TPC encoder 110. Alternatively, the stream of codewords c may be further encoded by one or both of an RS-ECC and an RLL code before being modulated by modulator 115. More generally, when multiple encoders are used, any suitable ordering of the encoders is possible.

Decoders corresponding to the multiple encoders, such as a Reed Solomon error correcting decoder and/or a run length limited decoder, may then be used in addition to the TPC decoder 135. Additionally or in the alternative, a run-length limited encoder and decoder may be used before the TPC encoder 110 and after the TPC decoder 135, respectively. One illustrative implementation that includes two run-length limited codes and an error correction code will be described below in connection with FIG. 7.

Figure 2:
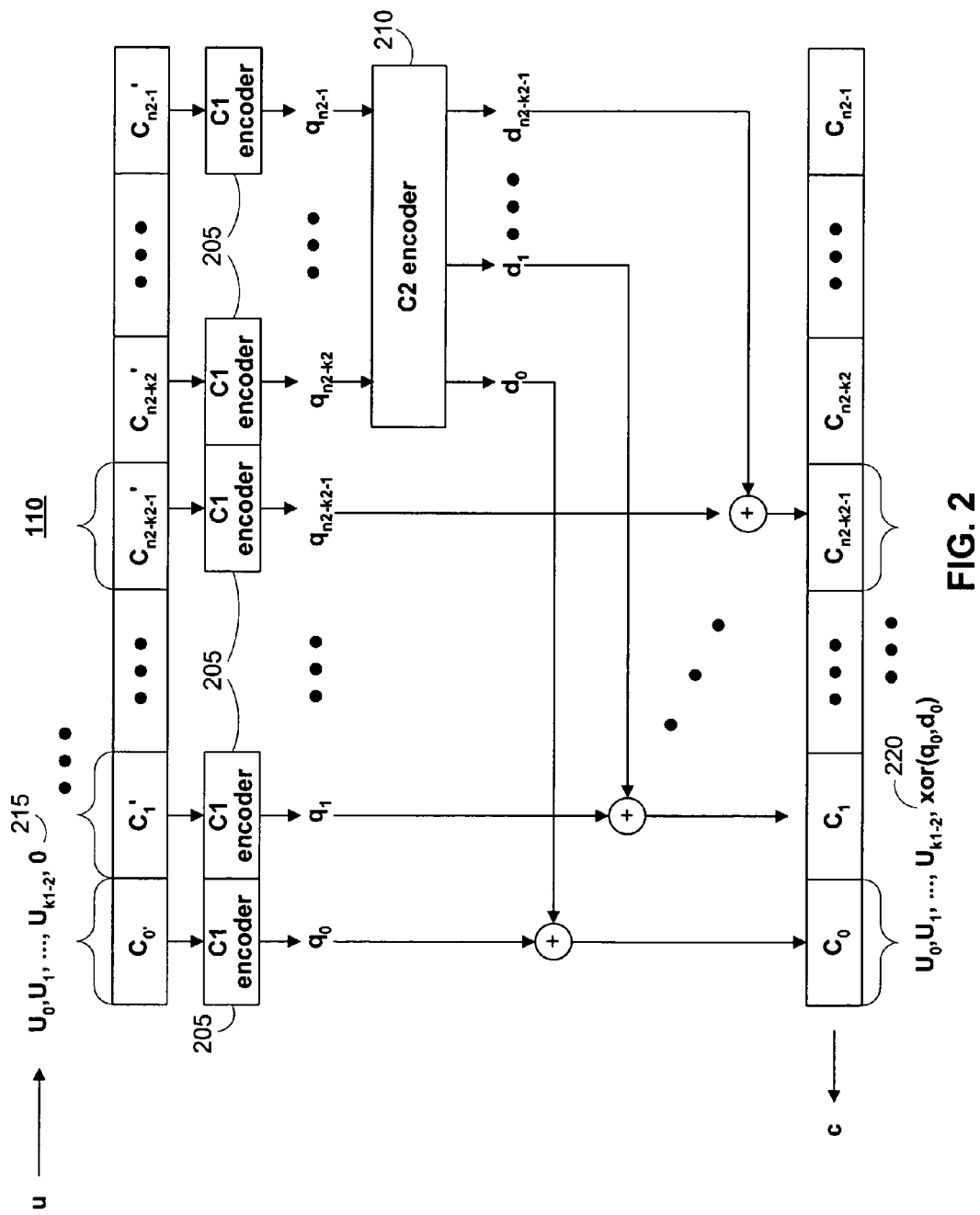
FIG. 2 is a block diagram of an exemplary TPC encoder architecture.

FIG. 2 illustrates an exemplary embodiment of the TPC encoder 110. Generally, TPC encoder 110 encodes the stream of datawords u based on two codes, which will be referred to herein as an inner code C1 and an outer parity hiding code C2. TPC encoder 110 generates a stream of codewords c which includes the user bits in the stream of datawords u, as well redundant bits. As mentioned above, "redundant" bits generally refer to bits associated with a stream of data that provide additional information about the stream of data. The additional information can be used by a decoder, such as a TPC decoder (135, FIG. 1), to detect and/or correct errors in a detected codeword.

In the illustrative TPC encoder 110, the final set of redundant bits that are ultimately included in the stream of codewords c are generated based on two other sets of redundant bits. The TPC encoder 110 first uses the inner code C1 to generate a first set of redundant bits. At least a portion of the first set of redundant bits is further encoded based on the outer parity hiding code C2 to generate a second set of redundant bits. The final set of redundant bits is formed by modifying the second set of redundant bits using the first set of redundant bits, and the final set of redundant bits are then transmitted over the channel 120 along with the user bits in the stream of datawords u. Since, as will be shown, the final set of redundant bits is generally smaller than the first set of redundant bits, this method has a lower code rate penalty than using inner code C1 alone to encode the stream of datawords u.

In certain embodiments the inner code C1 and the outer parity hiding code C2 are linear block codes. The inner code C1 is configured to produce a binary codeword of length n1 bits upon input of a binary dataword of length k1 bits, where n1 is greater than k1. As used herein, the "length" of a binary word, such as a dataword, a codeword, or a stream, refers to the number of bits included in the binary word. The difference (n1−k1) represents the number of redundant bits generated by inner code C1. In one practice, inner code C1 can be a systematic code, in which case the codeword of length n1 bits produced by inner code C1 includes the input dataword of length k1 bits, along with (n1−k1) redundancy bits. Similarly, outer parity hiding code C2 is configured to produce a binary codeword of length n2 bits upon input of a dataword of length k2 bits, where n2 is greater than k2. In one practice, as mentioned above with respect to inner code C1, outer parity hiding code C2 is a systematic code, in which case the binary codeword of length n2 bits produced by C2 includes the dataword of length k2 bits, along with (n2−k2) redundancy bits. For ease of explanation, from this point on the inner code C1 may be referred to simply as "C1," and the outer parity hiding code C2 may be referred to simply as "C2."

FIG. 2 illustrates an exemplary embodiment of the TPC encoder 110 which, as mentioned above, encodes the stream of datawords u. The TPC encoder 110 may encode the stream of datawords u one input dataword at a time, wherein an input dataword refers to a grouping of bits with a size suitable for use with TPC encoder 110. While the stream of datawords u may include several datawords, for purposes of explanation, the dataword u in FIG. 2 will be referred to as a single dataword of length k bits. Then, the TPC encoder 110 generates a single codeword c corresponding to the single input dataword u. However, in other embodiments, the TPC encoder 110 may generate a stream of multiple codewords c based on a stream of datawords u.

In one embodiment, the TPC encoder 110 is configured to provide a codeword c of length (k1·n2) bits. This configuration satisfies a property which will be referred to herein as "the fundamental property of TPC." The property states: partition the codeword c into n2 binary words each of length k1; using a C1 encoder, encode each of the n2 binary words to generate redundant bits for the n2 binary words; concatenate the redundant bits to form a binary word p; then, p will be a codeword of the outer parity hiding code C2. The fundamental property of TPC facilitates error correction and/or error detection by TPC decoder 135, as will be discussed with respect to FIGS. 3A-3B.

In the exemplary embodiment of FIG. 2, the TPC encoder 110 is configured to encode a dataword u of length k wherein k+(n2−k2) is a multiple of k1. However, in other embodiments where k+(n2−k2) is not a multiple of k1, the TPC encoder 110 can pad the dataword u with dummy bits, such as zero bits, to generate a padded dataword u' of length k' wherein k'+(n2−k2) is a multiple of k1. In this embodiment, the padded dataword u' can then be encoded by TPC encoder 110 to produce a codeword c.

The illustrated TPC encoder 110 of FIG. 2 operates as follows. The encoder first generates a preliminary codeword c' based on the dataword u by multiplexing (n1−k1) dummy bits (e.g., 0 bits) periodically within the dataword u to result in n2 binary words of length k1, wherein the first (n2−k2)/(n1−k1) binary words include bits from the dataword u followed by (n1−k1) dummy bits, and the remaining ones of the n2 binary words include only bits from the dataword u. In this illustrative embodiment, inner code C1 is a single parity check (SPC) code, so (n1−k1)=1 and a total of (n2−k2) dummy '0' bits 215 are inserted, one dummy bit 215 located at every k1$^{th}$ bit position of the dataword u, starting at position k1−1. As used herein, a "dummy" bit generally refers to a bit that provides no information about either the dataword u or redundancy bits associated therewith. The preliminary codeword c' is partitioned into n2 binary words $c_0'$ ... $c_{n2-1}'$, wherein each such binary word is of length k1. This can be done since the length of c' is a multiple of k1. In this case, binary words $c_0'$ ... $c_{n2-k2-1}'$ each include one dummy zero bit 215 in their respective last bit positions, while binary words $c_{n2-k2}'$ ... $c_{n2-1}'$ include only user data and do not include any dummy zero bits 215.

The binary words $c_0'$ ... $c_{n2-1}'$ are encoded by inner code C1 encoders 205. In FIG. 2, each binary word $c_0'$ ... $c_{n2-1}'$ has a respective inner code C1 encoder 205, but in other embodiments a plurality of the binary words $c_0'$ ... $c_{n2-1}'$ may be encoded by less than n2 inner code C1 encoders 205, e.g., a single C1 encoder 205.

The inner code C1 encoders 205 generate redundant bits $q_0$ ... $q_{n2-1}$, where each $q_i$, for i=1, ... n2−1, is a binary word of length n1−k1. In the illustrated embodiment, inner code C1 is a single parity check (SPC) code, in which case each of $q_0$ ... $q_{n2-1}$ corresponds to a single redundant bit. However, other inner codes C1 may be used as will be recognized by those skilled in the art. In particular, inner code C1 may be a code which generates a plurality of redundant bits, in which case $q_0$ ... $q_{n2-1}$ corresponds to binary words each having a plurality of redundant bits.

With continuing reference to FIG. 2, a subset of size k2 of the C1 redundant bits $q_0$ ... $q_{n2-1}$, such as redundant bits $q_{n2-k2}$ ... $q_{n2-1}$ as shown in FIG. 2, are provided to outer parity hiding code C2 encoder 210. In one aspect, outer parity hiding code C2 is an iterative code, such as, for example, a low density parity check (LDPC) code or a Turbo code. Outer parity hiding code C2 will be discussed in more detail with respect to FIGS. 3A, 3B, 4A, and 4B. Outer parity hiding code C2 encoder 210 generates redundant bits $d_0 \ldots d_{n2-k2-1}$. The codeword c is then generated by replacing the dummy bits in respective binary words $c_0' \ldots c_{n2-1}'$ with redundant bits 220 formed by respective modulo 2 sums to form codeword portions $c_0 \ldots c_{n2-1}$, and concatenating the codeword portions $c_0 \ldots c_{n2-1}$ to form codeword c. In particular, as shown in FIG. 2, the dummy bit in preliminary codeword $c_i'$ is replaced with redundant bit 220 $\text{xor}(q_i, d_i)$, for all i=0, ..., n2–k2–1. Binary words $C_{n2-k2} \ldots c_{n2-1}$ do not include redundant bits 220.

Generally, outer parity hiding code C2 is used to hide the redundancy of C1. A benefit of TPC codes is, in part, that since the redundancy of C1 is not directly transmitted, this encoding scheme provides the benefit of a shorter block parity code along with a lower code rate penalty. By way of example, if a dataword u has length k=4100 bits and inner code C1 is a 10/11 SPC code, then encoding with inner code C1 alone would result in an overhead of 4100/10=410 redundant bits. However, employing inner code C1 along with, for example, a Bose-Chaudhuri-Hochquenghem (BCH) parity hiding C2 code with k2=248 and n2=428 in a TPC encoding architecture as illustrated in FIG. 2 would result in a lower overhead of n2-k2=180 redundant bits.

FIG. 2 illustrates one exemplary architecture for a TPC encoder 110 that generates codewords c satisfying the fundamental property of TCP. However, other embodiments of the TPC encoder 110 may also be used, as known in the art.

Figure 3A:
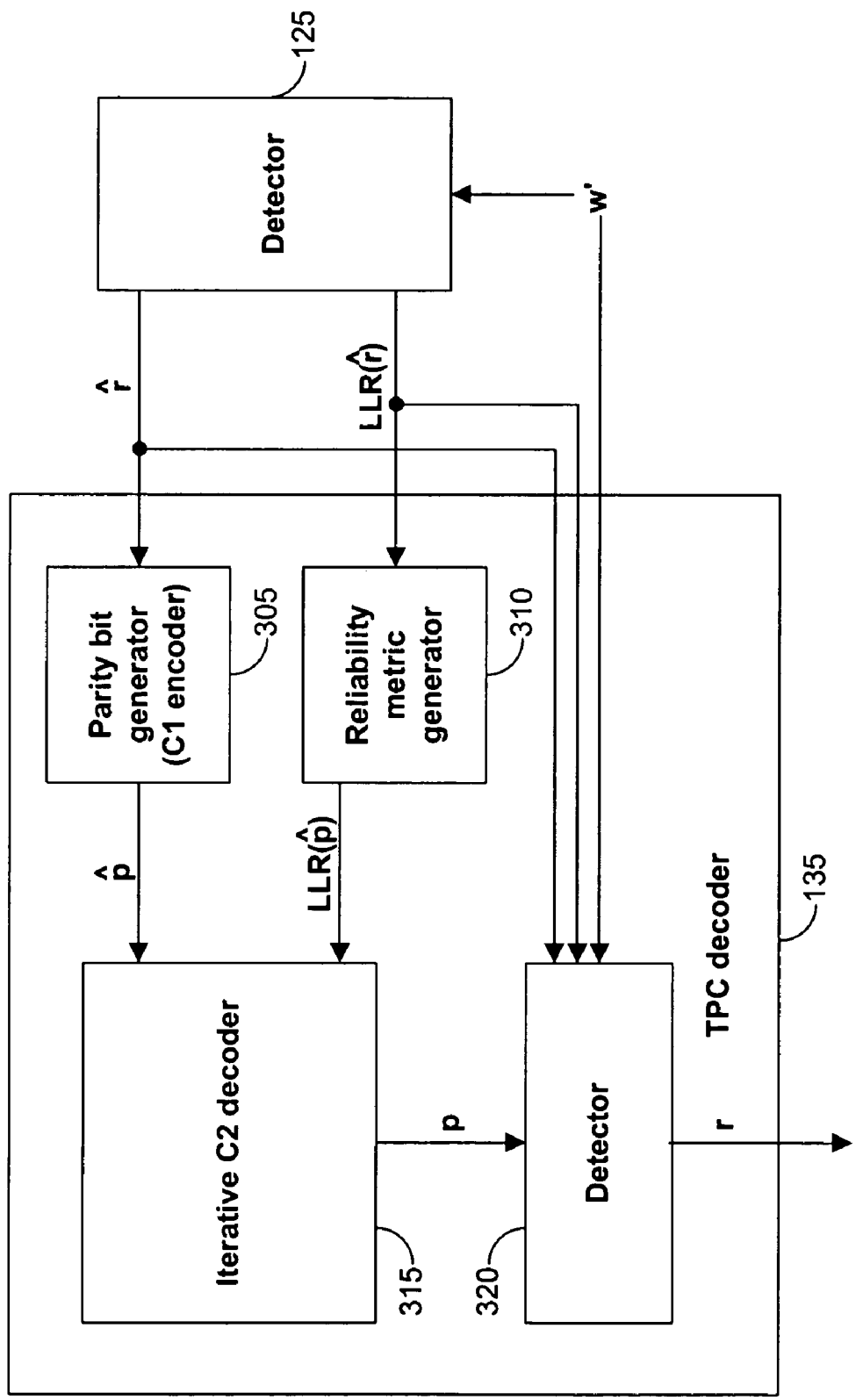
FIG. 3A is a block diagram of an exemplary detector and TPC decoder in accordance with one aspect of the invention.

Referring again to FIG. 1 as well as to FIG. 3A, the stream of codewords c is modulated onto a transmitted signal w and transmitted over channel 120 which, as discussed above, may corrupt certain bits of the stream of codewords c. Thus, a received signal w' may not be the same as the transmitted signal w, and in turn, after demodulating and detecting the signal w' to provide a stream of detected codewords r̂, the stream of detected codewords r̂ may not be the same as the stream of codewords c. The detector 125 and TPC decoder 135 operate to determine the stream of codewords c by demodulating and detecting the received signal w', recovering an estimate p̂ of the redundant bits p=$d_0, \ldots, d_{n2-k2-1}$, $q_{n2-k2}, \ldots, q_{n2-1}$ associated with inner code C1 and outer parity hiding code C2 as discussed above, decoding the recovered redundant bits p̂ using outer parity hiding code C2 decoder 315 to generate decoded redundant bits p, and re-detecting the received signal w' utilizing information associated with the decoded redundant bits p. In one aspect, outer parity hiding code C2 decoder 315 is an iterative decoder 315 that operates in part based on reliability metrics associated with the redundant bits. This is realized in part by reliability metric generator 310 which provides reliability metrics to iterative decoder 315.

Figure 5:
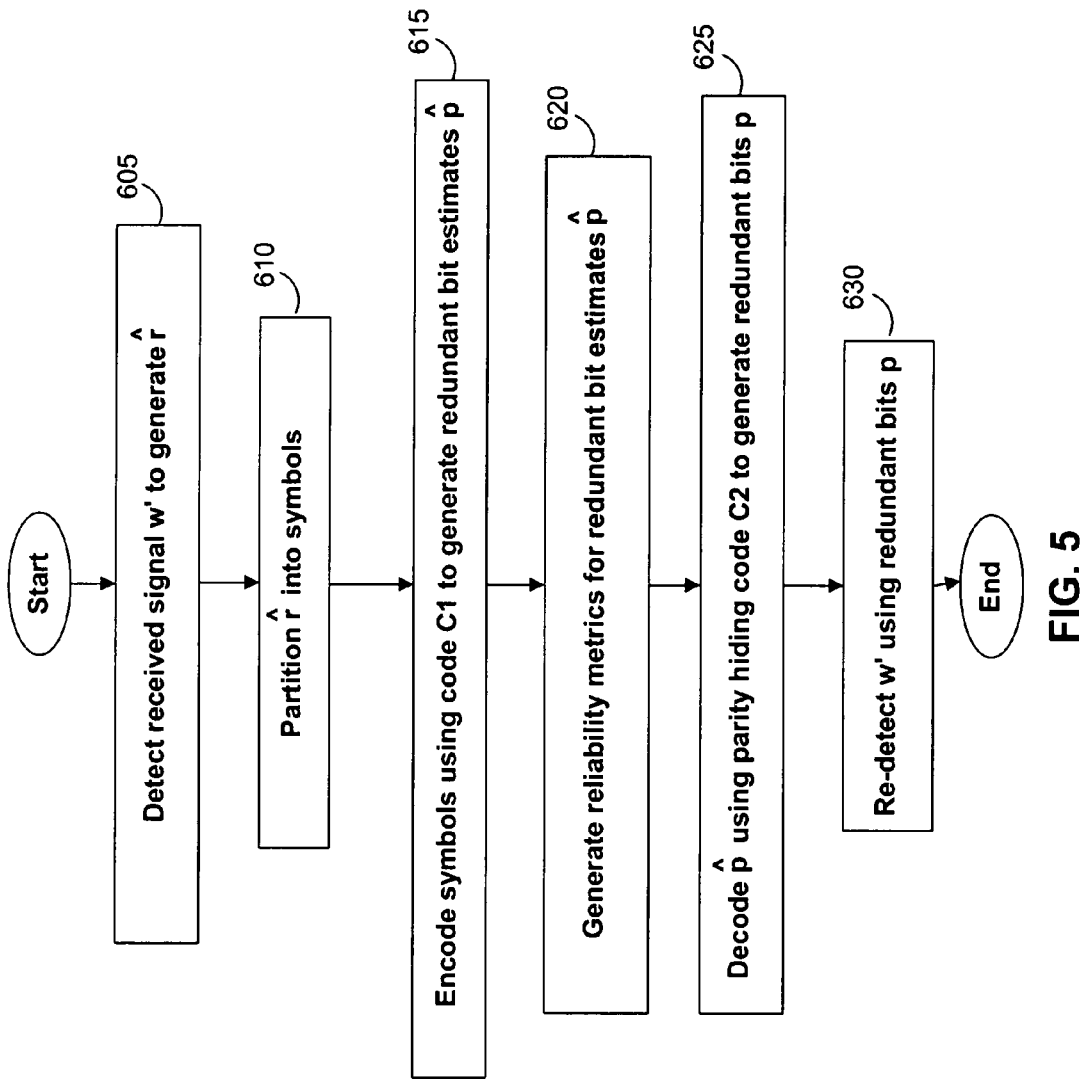
FIG. 5 is an exemplary flow diagram of a detecting and decoding process consistent with aspects of the invention.

Referring to FIG. 3A and FIG. 5, one embodiment of the detector 125 and TPC decoder 135 will be described. The detector 125 processes the stream of received data w' to generate a stream of detected codewords r̂ (step 605 in FIG. 5). In one practice, the detector 125 includes a hard decision generator, such as a Viterbi detector, that is used to generate the stream of detected codewords r̂ which includes (possibly corrupted) user bits and (possibly corrupted) redundant bits. As used herein, a "hard decision" generator generally refers to a device/circuit that provides detection and/or decoding without the benefit of reliability metrics. For example, detection can be accomplished by choosing a codeword associated with the TPC encoder 110 that is "closest" to a detected codeword. As used herein, "closest" may refer to, for example, the smallest Hamming distance or Euclidean distance. Alternative hard detection methods as known in the art may also be used.

The detector 125 may also include a reliability metric generator that is used to generate reliability metrics associated with the stream of detected codewords r̂. In the exemplary embodiment of FIG. 3A, the reliability metrics include log likelihood ratios of the stream of detected codewords r̂ and are denoted as LLR (r̂). However, other reliability metrics may be used, such as likelihood information associated with the stream of detected codewords r̂. Exemplary detectors 125 that may be used to provide the detected codewords r̂ and/or the reliability metrics LLR(r̂) include a soft output Viterbi algorithm (SOVA) detector, and a Bahl Cocke Jelinck Raviv (BCJR) detector.

Figure 3B:
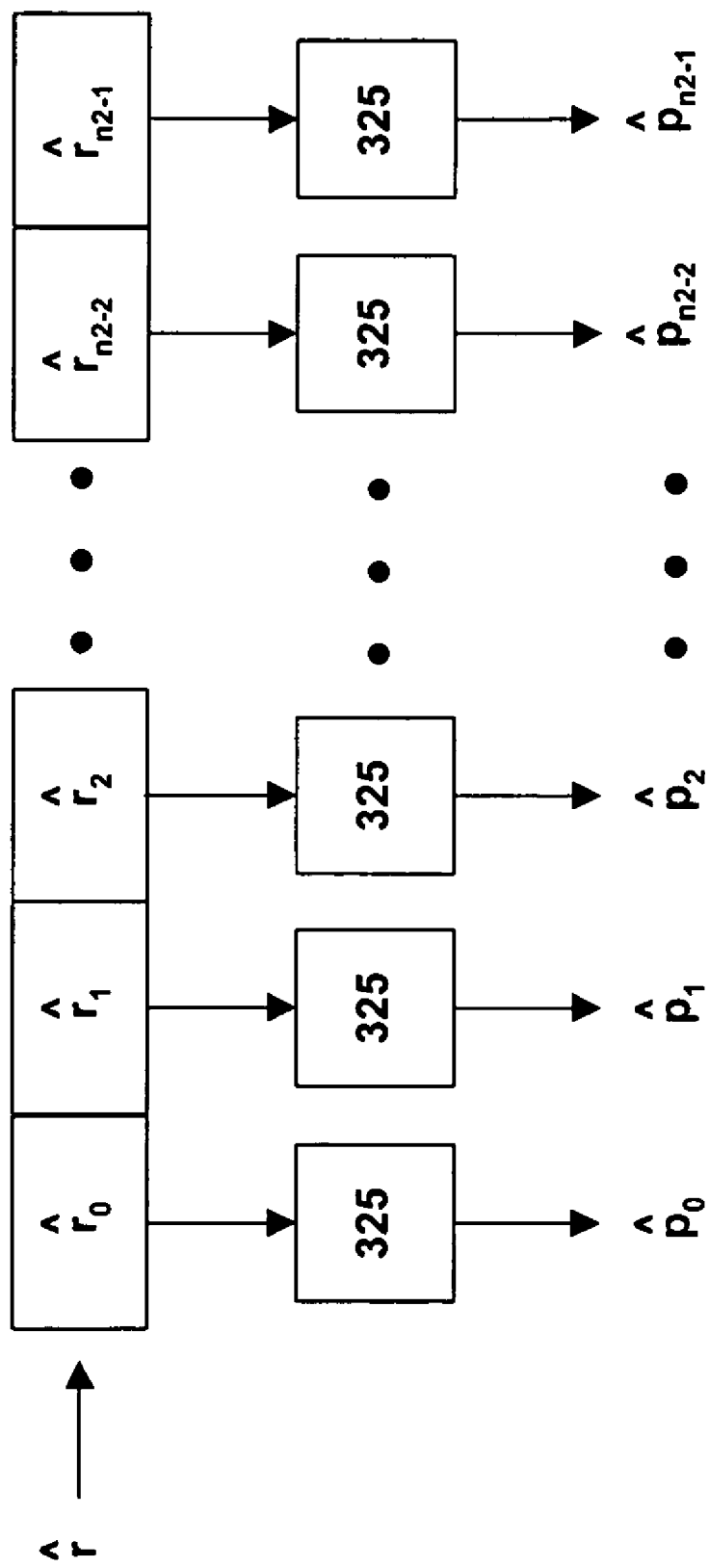
FIG. 3B is a block diagram illustrating the parity generator 305 of FIG. 3A.

The TPC decoder 110 includes a parity bit generator 305, which is illustrated in more detail in FIG. 3B. The stream of detected codewords r̂ is partitioned (step 610 in FIG. 5) into n2 binary words $\hat{r}_0 \ldots \hat{r}_{n2-1}$ each of length k1. Each of the binary words $\hat{r}_0 \ldots \hat{r}_{n2-1}$ is encoded (step 615 in FIG. 5) with an inner code C1 encoder 325 to generate respective redundant bit estimates $\hat{p}_0 \ldots \hat{p}_{n2-1}$ of the redundant bits $p_0 \ldots p_{n2-1}$ that were described in connection with FIG. 2. If one of the datawords $\hat{r}_i$ is free of errors, then its corresponding redundant bit estimate $\hat{p}_i$ will be the same as the redundant bit $p_i$. However, if $\hat{r}_i$ has errors, then redundant bit estimate $\hat{p}_i$ may not coincide with redundant bit $p_i$. Using the fundamental property of TPC codes mentioned above, a codeword p̂ formed by concatenating the redundant bit estimates $\hat{p}_0 \ldots \hat{p}_{n2-1}$ will be a codeword of outer parity hiding code C2 in the case where the detected data stream r̂ is free of errors. Discrepancies in redundant bit estimates p̂ with respect to the redundant bits p resulting from errors in the stream of detected codewords r̂ can be corrected by a outer parity hiding code C2 decoder 315.

Thus, TPC decoder 135 includes an iterative decoder 315 which decodes the redundant bit estimate p̂ to generate the redundant bits p. In addition to the redundant bit estimate p̂, the iterative decoder 315 makes use of reliability metrics associated with the redundant bit estimate p̂. In the embodiment illustrated in FIG. 3A, the reliability metrics are log likelihood ratios of the redundant bit estimates p̂ and are denoted LLR(p̂). However, other reliability metrics, such as likelihood ratios, may also be used.

In certain embodiments, the reliability metric generator 310 generates the reliability metrics (step 620 in FIG. 5) LLR(p̂) by mapping the reliability metrics LLR (r̂) into the reliability metrics LLR(p̂). Generally, the reliability metrics LLR(p̂) include a reliability metric (LLR($\hat{p}_i$)) associated with each constituent redundant bit $\hat{p}_i$, i=0, ..., n2–1. The quantity LLR($\hat{p}_i$) can be given by $$LLR(\hat{p}_i) = \ln Pr(p_i=1) - \ln Pr(p_i=0)$$

where Pr(x) is the probability of event x occurring. Various methods can be used to compute the quantities LLR($\hat{p}_i$). By way of example, in the case of a 2/3 SPC inner code C1, LLR($\hat{p}_i$) can be given, for i=0, ..., n2–1, as $$LLR(\hat{p}_i) = \text{sgn}(\hat{p}_i) \cdot \min\{|LLR(\hat{r}_{i,0})|, |LLR(\hat{r}_{i,1})|\}$$

where sgn( ) maps from a scalar to a sign (+ or –) of that scalar, $\hat{r}_i$ denotes the dataword based on which the redundant bit $\hat{p}_i$ as calculated (as illustrated in FIG. 3B), and $\hat{r}_{i,m}$ denotes the $m^{th}$ bit of the binary word $\hat{r}_i$. This method of calculating LLR($\hat{p}_i$) is based on the scenario where $\hat{p}_i$ and $\hat{r}_i$ are related by $$\hat{p}_i = \hat{r}_{i,0} + \hat{r}_{i,1},$$

where the addition is a modulo 2 addition. However, other methods for generating the reliability metrics LLR($\hat{p}$) known in the art may be used.

The iterative decoder 315 makes use of the redundant bit estimate $\hat{p}$ and the reliability metrics LLR($\hat{p}$) to decode (step 625 in FIG. 5) the redundant bit estimates $\hat{p}$ and thereby generate decoded redundant bits p which coincides with the true value of the C1 redundant bits p illustrated in FIG. 2. In some cases, $\hat{p}$ may be decoded incorrectly and generate a result that does not coincide with the redundant bits p, and this will be discussed below.

Various iterative decoders may be used to decode the redundant bit estimate $\hat{p}$. Generally speaking, iterative decoders include decoders which iteratively refine estimates of a codeword based at least in part on reliability metrics obtained at the previous iteration. In certain embodiments, this is realized by passing the estimates iteratively among one or more decoder elements. Reliability metrics generated in one decoding iteration are used as inputs for a subsequent iteration until the decoding terminates.

Figure 4B:
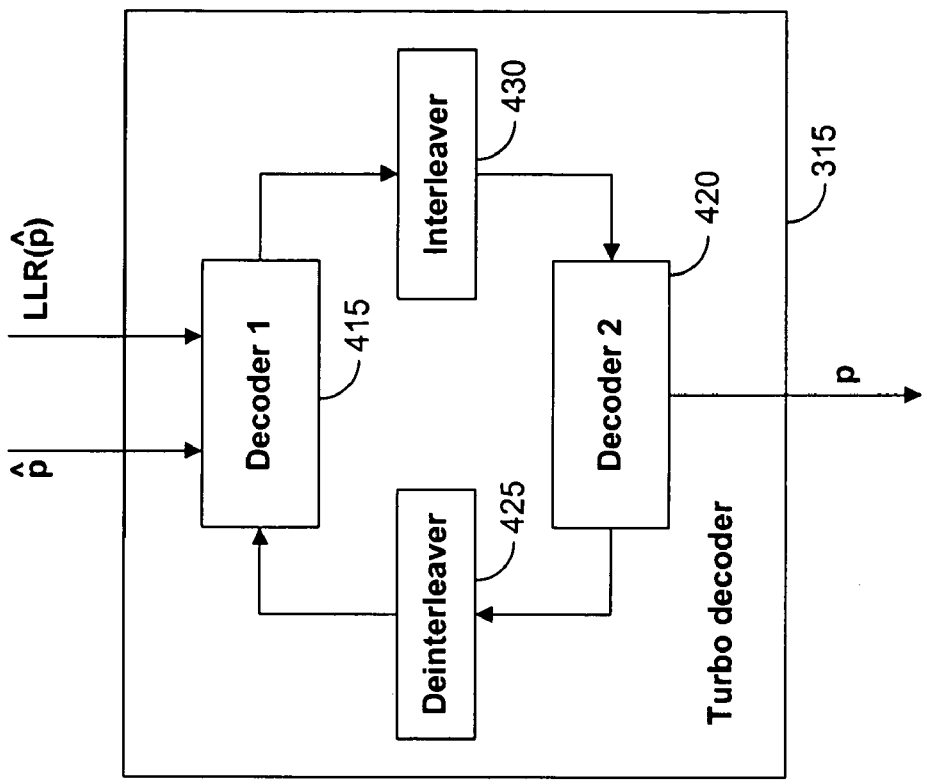
FIG. 4B is a block diagram of an exemplary turbo decoder.
Figure 4A:
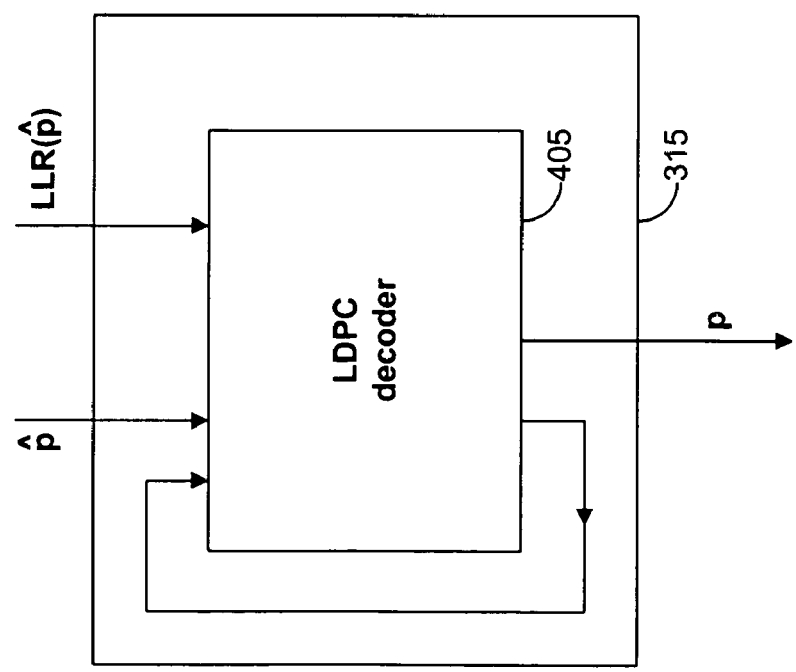
FIG. 4A is a block diagram of an exemplary low density parity check decoder.

FIG. 4 illustrates two exemplary iterative decoders that may be used with this invention. In particular, FIG. 4A illustrates a low density parity check (LDPC) decoder 315 that includes an LDPC decoding element 405. The decoding element begins with an initial estimate $\hat{p}$ along with associated reliability metrics LLR($\hat{p}$), and decoder element 405 iteratively generates refined estimates and reliability metrics until the estimates and reliability metrics converge. Similarly, FIG. 4B illustrates a turbo decoder including a first decoder 415, a second decoder 420, an interleaver 430, and a deinterleaver 425. Turbo decoder 315 cyclically passes updated reliability metric information associated with the redundant bit estimates $\hat{p}$ between a first decoder 415 and a second decoder 420 until the reliability metric information passed between the first decoder 415 and second decoder 420 converges. Upon convergence, iterative decoders 315 can generate decoded redundant bits p. With respect to FIG. 4B, in one embodiment, first decoder 415 and second decoder 420 correspond to systematic convolutional decoders. Other implementations of the LDPC and/or Turbo decoders and variations thereof as known in the art may be practiced with this invention. Convergence criteria for iterative C2 decoder 315 can vary and can be user-defined.

Referring again to FIG. 3, and in accordance with one aspect of the invention, the decoded redundant bits p are used by a second detector 320 to re-detect (step 630 in FIG. 5) the stream of received data w'. The second detector 320 makes use of the decoded redundant bits p to provide a stream of decoded codewords r. In particular, the decoded redundant bits p provide the second detector 320 with constraints that aid in detecting the stream of received data w', and the use of these constraints provides a coding gain to the TPC decoder 135. By way of example, if the inner code C1 is a 2/3 SPC code, then the following constraint relating the stream of decoded codewords r and the redundant bits $p_i$ for i=0, ..., n2−1 can be employed:

$$r_{i,0} + r_{i,1} = p_i$$

wherein $r_i$ denotes the possibly corrupted version of binary word $c_i$, $r_{i,m}$ denotes the $m^{th}$ bit of the binary word $r_i$, and the addition is performed modulo 2. In this example, if $p_i$=0, then $r_{i,0}$ will be constrained to be equal to $r_{i,1}$, whereas if $p_i$=1, then $r_{i,0}$ will be constrained to be the complement of $r_{i,1}$. The second detector 320 may take as input w', $\hat{r}$, and/or LLR ($\hat{r}$) as the input for its redetection.

The set of constraints that can be employed by the second detector 320 will of course depend on the choice of the inner code C1. In one aspect, the second detector 320 is a Viterbi detector using a trellis-based detection scheme. In this case, enforcing a constraint may include pruning branches on the Viterbi trellis that are inconsistent with the constraints associated with the decoded redundant bits p. Although the first detector 125 and the second detector 320 are shown in FIG. 3A as two separate detectors, in certain embodiments they may correspond to the same detector.

Referring again to FIG. 3A, the decoded redundant bits p are illustrated as coinciding with the redundant bits p. However, in certain instances this may not be the case. By way of example, the iterative decoder 315 may fail to converge and thus may fail to generate the redundant bits p. Alternatively, the iterative decoder 315 may converge but may generate decoded redundant bits p' that are not the same as the inner code C1 redundant bits p. In the case where the iterative decoder 315 does not converge, the TPC decoder 135 may provide the stream of detected codewords $\hat{r}$ as the stream of decoded codewords r. In the case where the iterative decoder 315 generates decoded redundant bits p' that do not coincide with C1 redundant bits p, the detector 320 may nonetheless use p' as a basis for constraints in its detection, and this may provide a coding gain despite the inequality of decoded redundant bits p' and C1 redundant bits p.

In the embodiment discussed above, the iterative C2 decoder is used as the basis for a second redetection by detector 320. However, in other embodiments, the iterative C2 decoder 315 is also used in part to choose between two candidate decodings. In particular, the detector 125 may generate, in addition to $\hat{r}$, a second stream of detected codewords $\hat{s}$ (not shown). The process described above with respect to $\hat{r}$ is repeated for $\hat{s}$ to generate a second stream of decoded codewords s. Then, one of r and s can be chosen as the final output of the TPC decoder 135 based on the results of the iterative C2 decoder 315. For example, reliability metrics associated with the streams of detected codewords $\hat{r}$ and $\hat{s}$ can be used as a basis for a decision. In certain embodiments, the final output of the TPC decoder 135 is some combination of portions of $\hat{r}$ and $\hat{s}$.

Figure 6:
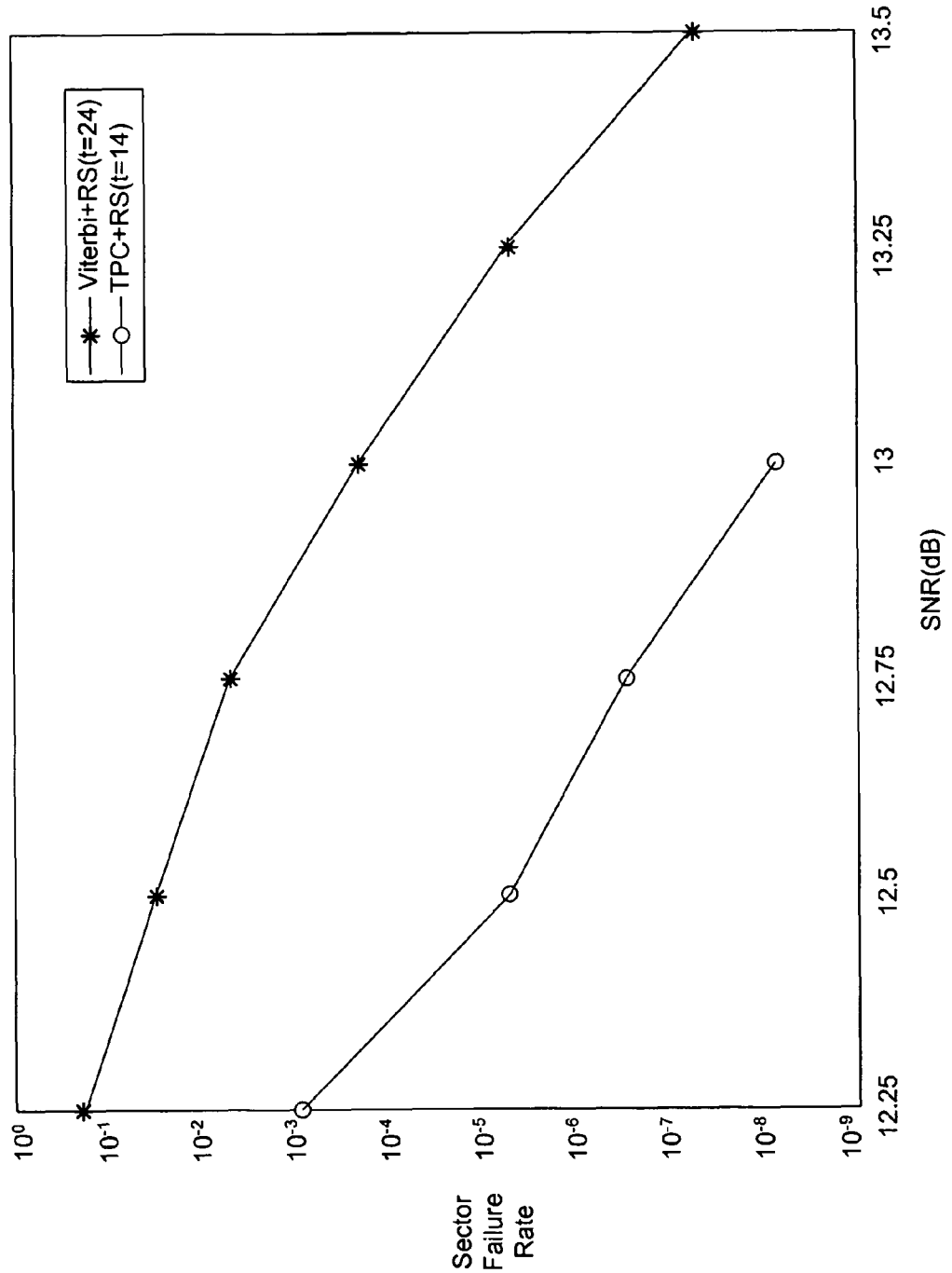
FIG. 6 shows a graph illustrating the coding gain offered by one embodiment of the invention.

FIG. 6 shows a graph demonstrating the coding gain of TPC's as described herein. The graph sets forth signal to noise ratio (SNR) in decibels (dB) on one axis, and a sector failure rate on another axis. A first system, identified as "Viterbi+RS," includes a hard Viterbi detector concatenated with an outer Reed-Solomon error correcting code. A second system, identified as "TPC+RS," employs a tensor product code including an iterative outer parity hiding code C2, as described herein, concatenated with an outer Reed-Solomon error correcting code. The Reed-Solomon error correcting code in the first system has a correction power of 24, and the Reed-Solomon error correcting code in the second system has a correction power of 14. These correction powers were chosen such that both systems employ the same amount of redundancy overhead. As illustrated in the graph, the second system offers a Sector Failure Rate gain of about 0.75 dB over the first system.

Figure 7:
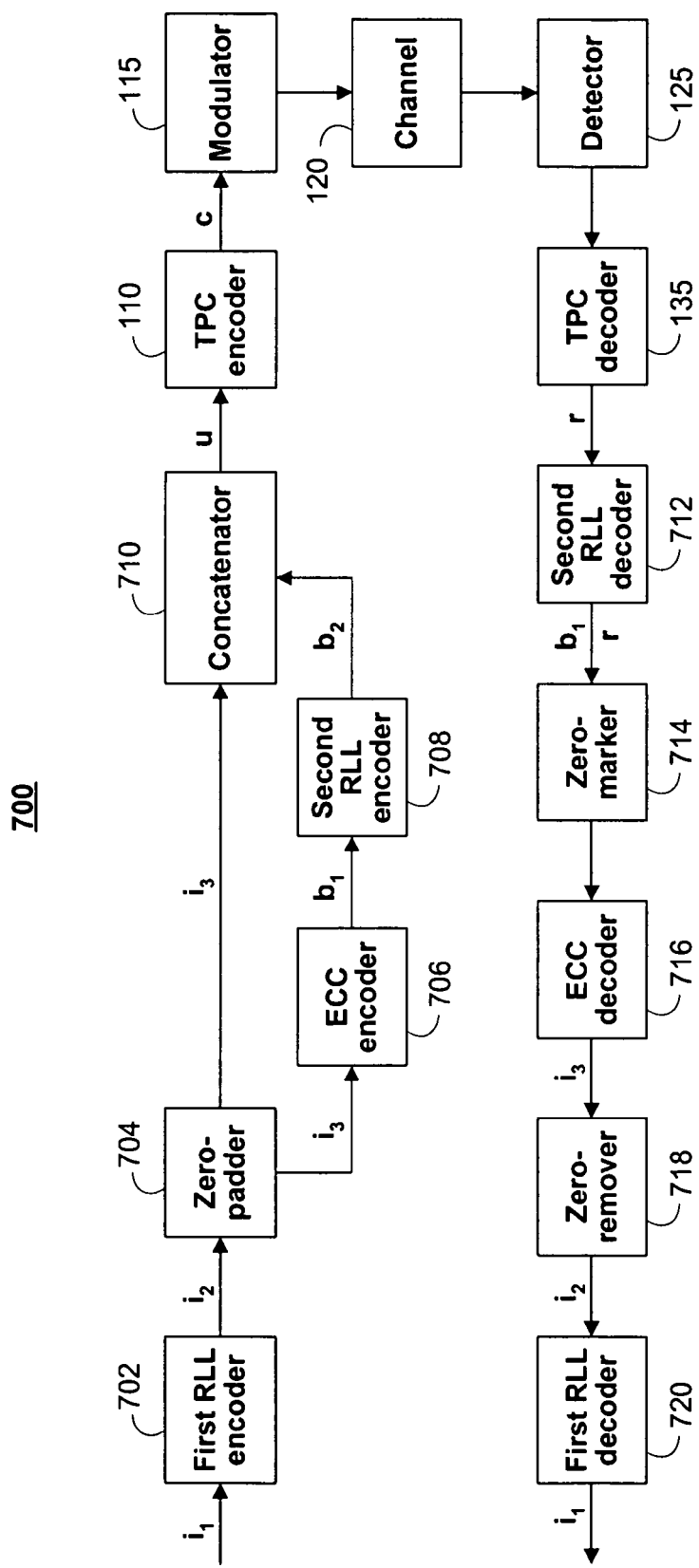
FIG. 7 shows a block diagram of a communication system including the system of FIG. 1.

While the system 100 described above can be used alone, it may also be part of a larger system. In accordance with one aspect of the invention, FIG. 7 shows an exemplary system 700 that includes the system 100 along with other encoding and decoding functional blocks. More particularly, the system 700 includes the TPC encoder 110, the modulator 115, the channel 120, the detector 125, and the TPC decoder 135 discussed above. Additionally, the system 700 includes a first run-length limited (RLL) encoder 702, a zero-padder 704, an error correction code (ECC) encoder 706, a second RLL encoder 708, and a concatenator 710. These blocks 702-710 collectively encode an initial stream of data, such as the depicted dataword $i_1$, to produce the dataword u, and the dataword u is then further encoded by TPC encoder 110 to produce the codeword c.

The system 700 also includes a second RLL decoder 712 corresponding to the second RLL encoder 708, a zero marker 714, an ECC decoder 716 corresponding to the ECC encoder 706, a zero remover 718, and a first RLL decoder 720 corresponding to the first RLL encoder 702. These collectively further decode the stream of decoded codewords r produced by the TPC decoder 135 to generate the dataword $i_1$.

In operation, the first RLL encoder 702 encodes the dataword $i_1$ using any run-length limited encoding methods known in the art to produce a first stream of data, such as the depicted encoded dataword $i_2$. Next, a zero padder 704 performs padding to insert dummy bits, such as zero bits, into the dataword $i_2$ using the method of inserting dummy bits discussed above in connection with the system 100 of FIG. 2. More particularly, in this exemplary implementation, the TPC encoder 110 does not multiplex dummy bits into the dataword u as was described in connection with FIG. 2. Instead, in system 700 the zero padder 704 performs this function. More particularly, using the example of a single parity check (SPC) code for the inner code C1, the zero padder 704 can produce the dataword $i_3$ by multiplexing (n2−k2) zero bits within the dataword $i_2$, with one zero bit located at every $k1^{th}$ bit position of the encoded dataword $i_2$, starting at the bit position k1−1 of the dataword $i_2$.

The ECC encoder 706 then processes the dataword $i_3$ to produce parity bits $b_1$. The ECC encoder 706 uses any error correction encoding method known in the art; i.e., a Reed Solomon error correcting code (RS-ECC). The parity bits $b_1$ are then encoded by a second RLL encoder 708 to produce a third stream of data, such as the depicted encoded parity bits $b_2$. The concatentor 710 then concatenates the encoded parity bits $b_2$ to the dataword $i_3$ (e.g., at the end of the dataword $i_3$) to produce the dataword u.

The dataword u is processed as described above in connection with FIGS. 1-6 to produce the stream of decoded codewords r. In accordance with one aspect of the invention, the decoded codewords r can be processed by several functional blocks 712-720 to recover the dataword $i_1$. In particular, the stream of decoded codewords r include the encoded parity bits $b_2$ and the dataword $i_3$. Next, the second RLL decoder 712 decodes the encoded parity bits $b_2$ to recover the parity bits $b_1$. In one embodiment, the zero-marker does not affect the parity bits $b_1$, but rather, the zero-marker can operate on the dataword $i_3$. Therefore, the second RLL decoder 712 can communicate the parity bits $b_1$ directly to the ECC decoder 716 or through the zero-marker 714 to the ECC decoder 716 (as illustrated).

The zero marker 714 can receive the dataword $i_3$ or the decoded codewords r directly from the TPC decoder 135 or through the second RLL decoder 712. Next, the zero marker 714 inserts zero bits at the appropriate locations in the dataword $i_3$. Then, the ECC decoder 716 processes the dataword $i_3$ and the parity bits $b_1$ to correct remaining errors, if any, to produce a third stream of data, depicted as the corrected padded dataword $i_3$. The zero remover 718 removes the zeros corresponding to the zeros that were initially inserted by the zero padder 704 and subsequently by the zero marker 714 to produce a fourth stream of data, depicted by the encoded dataword $i_2$. Finally, the first RLL decoder 720 decodes the dataword $i_2$ to produce the initial dataword $i_1$.

Accordingly, what have been described thus far are systems and methods for encoding and decoding data using a tensor product code. The components of the illustrated figures can be implemented using digital hardware, analog hardware, and/or a processor architecture with programmable instructions.

Referring now to FIGS. 8A-8G, various exemplary implementations of the present invention are shown.

Figure 8A:
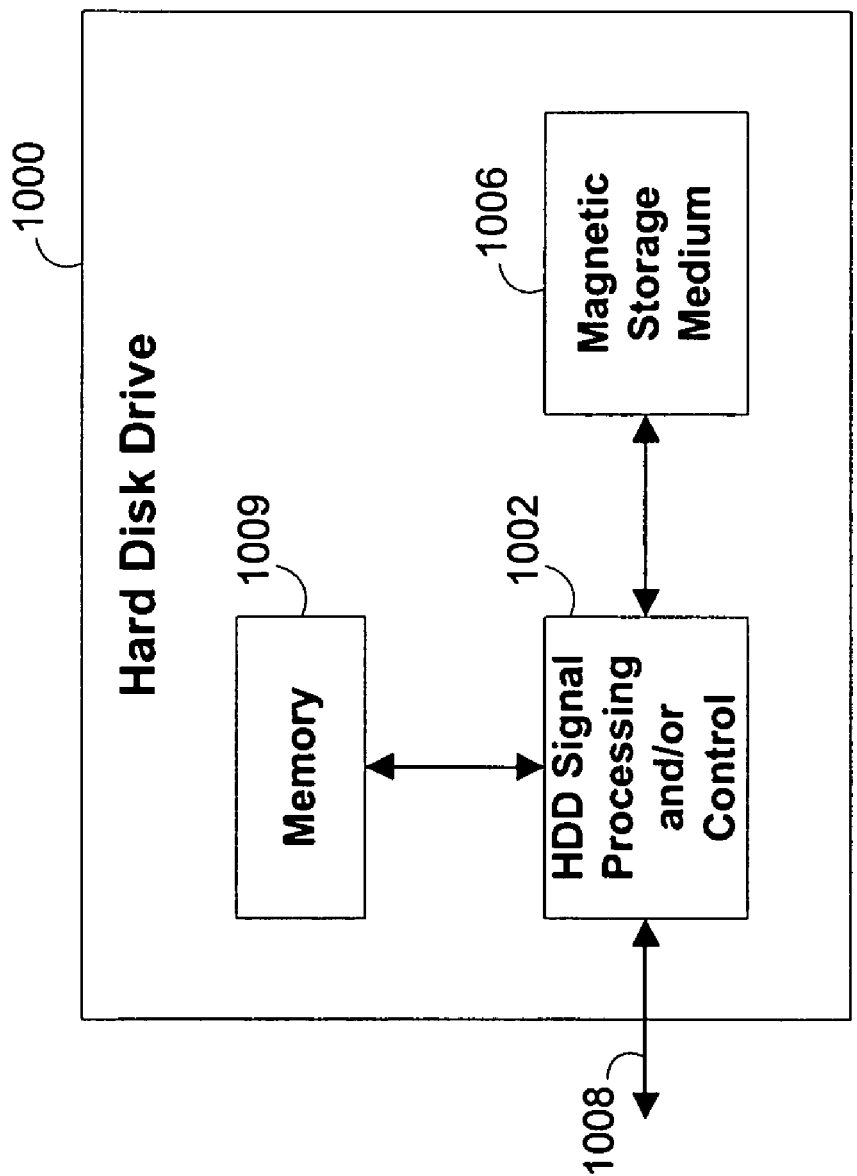
FIG. 8A is a block diagram of an exemplary hard disk drive that can employ the disclosed technology.

Referring now to FIG. 8A, the present invention can be implemented in a hard disk drive 1000. The present invention may implement either or both signal processing and/or control circuits, which are generally identified in FIG. 8A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 8B:
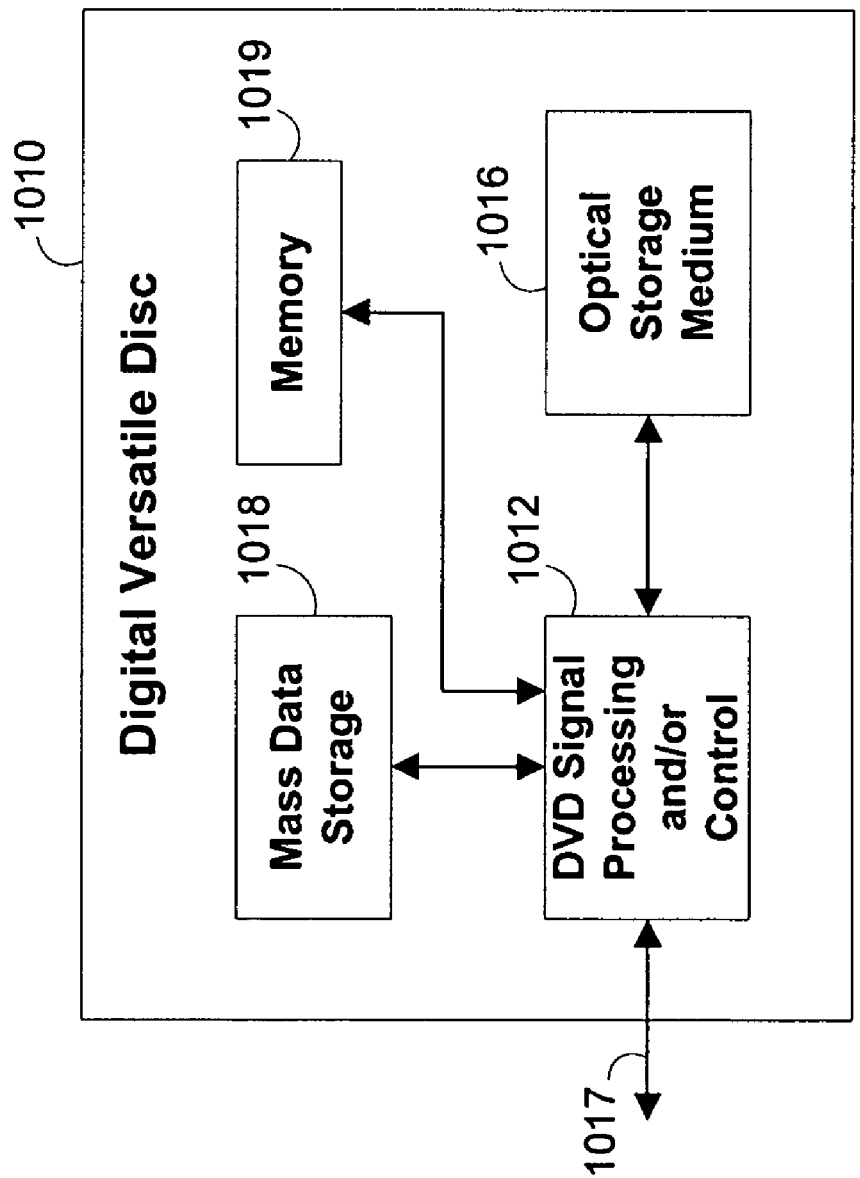
FIG. 8B is a block diagram of an exemplary digital versatile disc that can employ the disclosed technology.

Referring now to FIG. 8B, the present invention can be implemented in a digital versatile disc (DVD) drive 1010. The present invention may implement either or both signal processing and/or control circuits, which are generally identified in FIG. 8B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 8A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 8C:
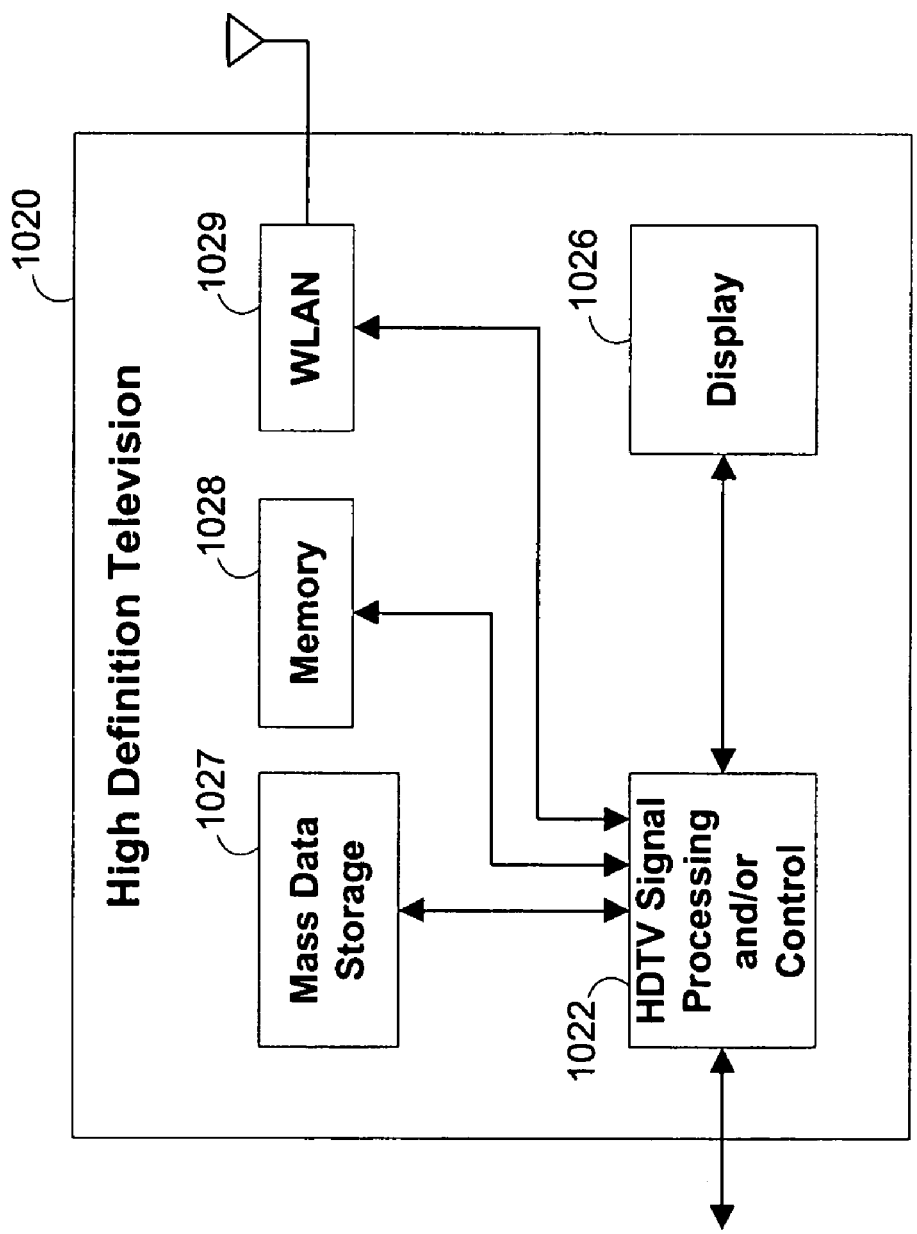
FIG. 8C is a block diagram of an exemplary high definition television that can employ the disclosed technology.

Referring now to FIG. 8C, the present invention can be implemented in a high definition television (HDTV) 1020. The present invention may implement either or both signal processing and/or control circuits, which are generally identified in FIG. 8C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 8A and/or at least one DVD may have the configuration shown in FIG. 8B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 8D:
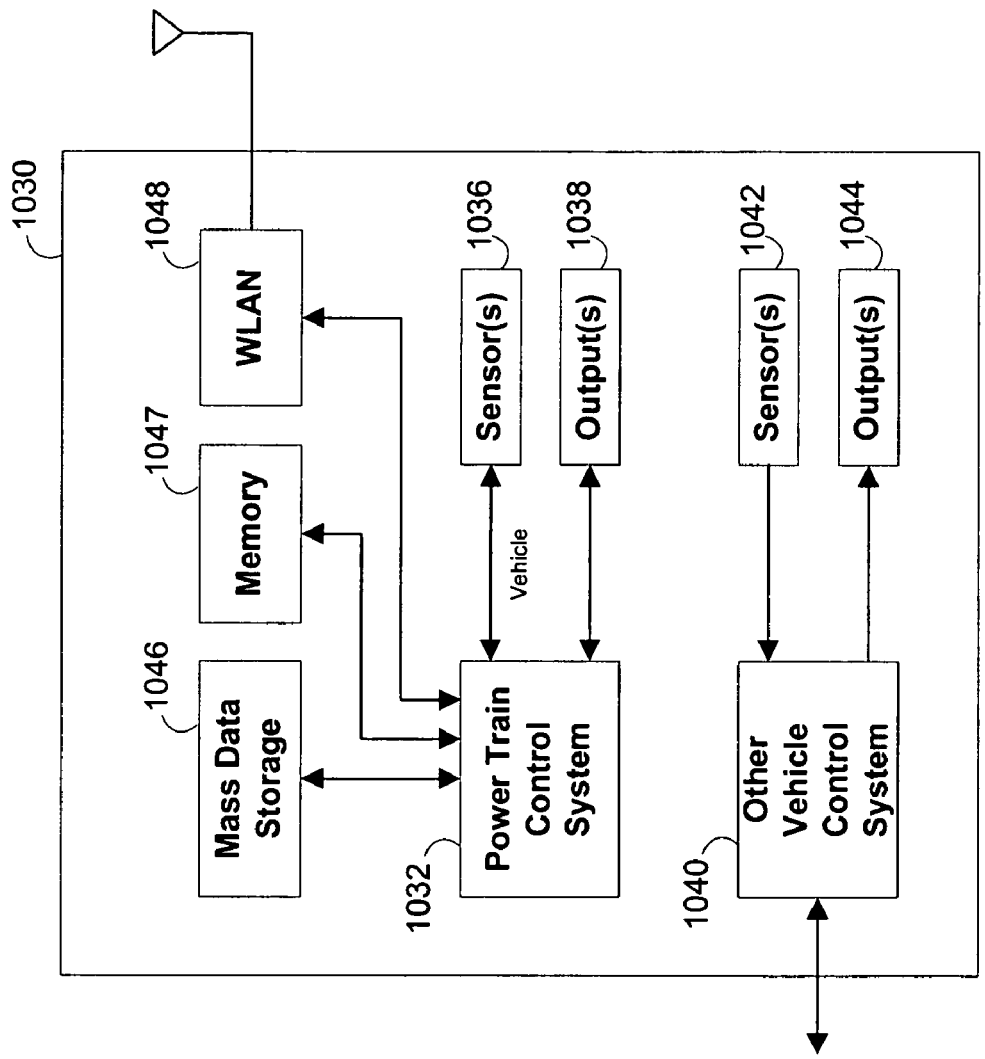
FIG. 8D is a block diagram of an exemplary vehicle that can employ the disclosed technology.

Referring now to FIG. 8D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 8E:
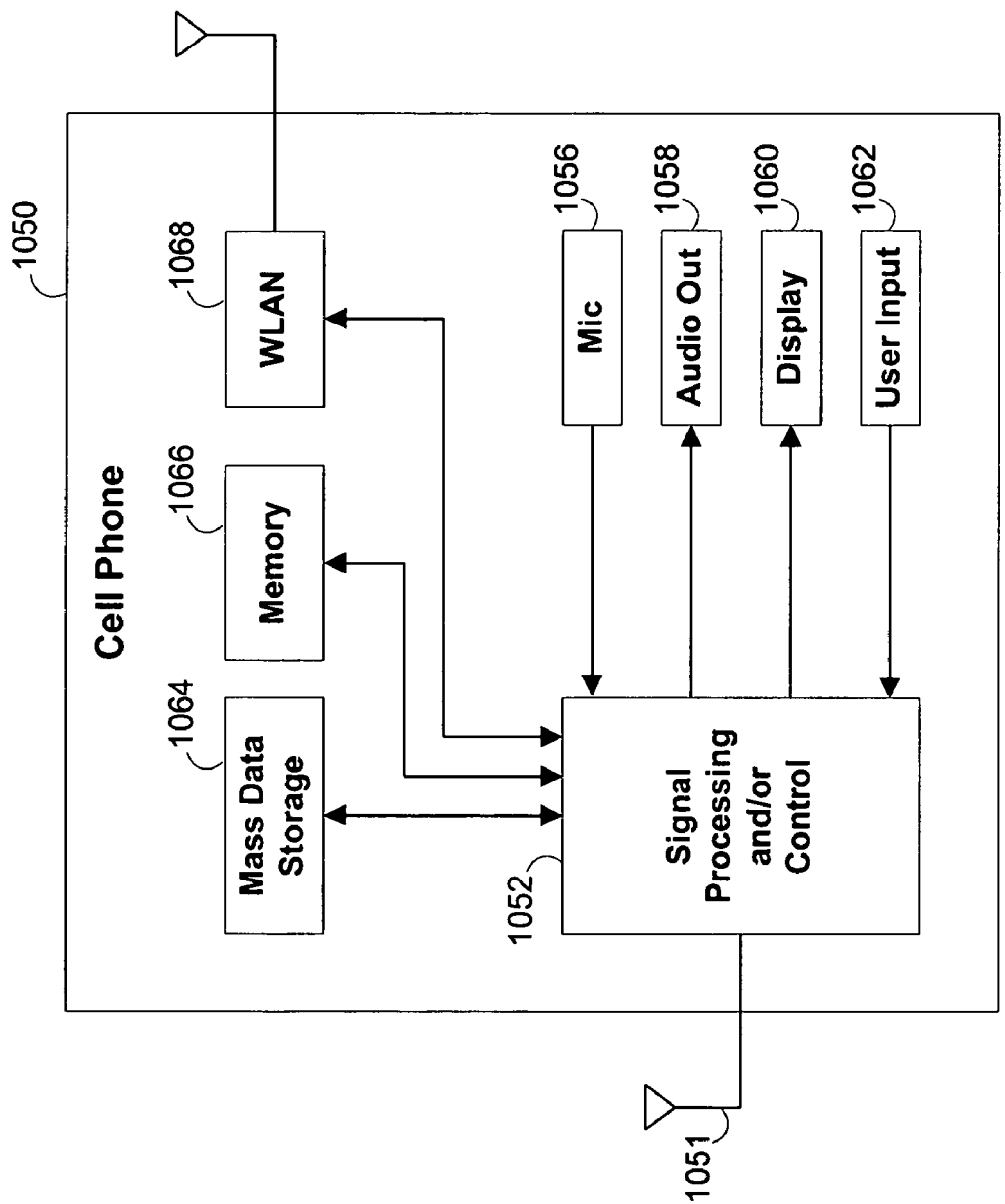
FIG. 8E is a block diagram of an exemplary cell phone that can employ the disclosed technology.

Referring now to FIG. 8E, the present invention can be implemented in a cellular phone 1050 that may include a cellular antenna 1051. The present invention may implement either or both signal processing and/or control circuits, which are generally identified in FIG. 8E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 8F:
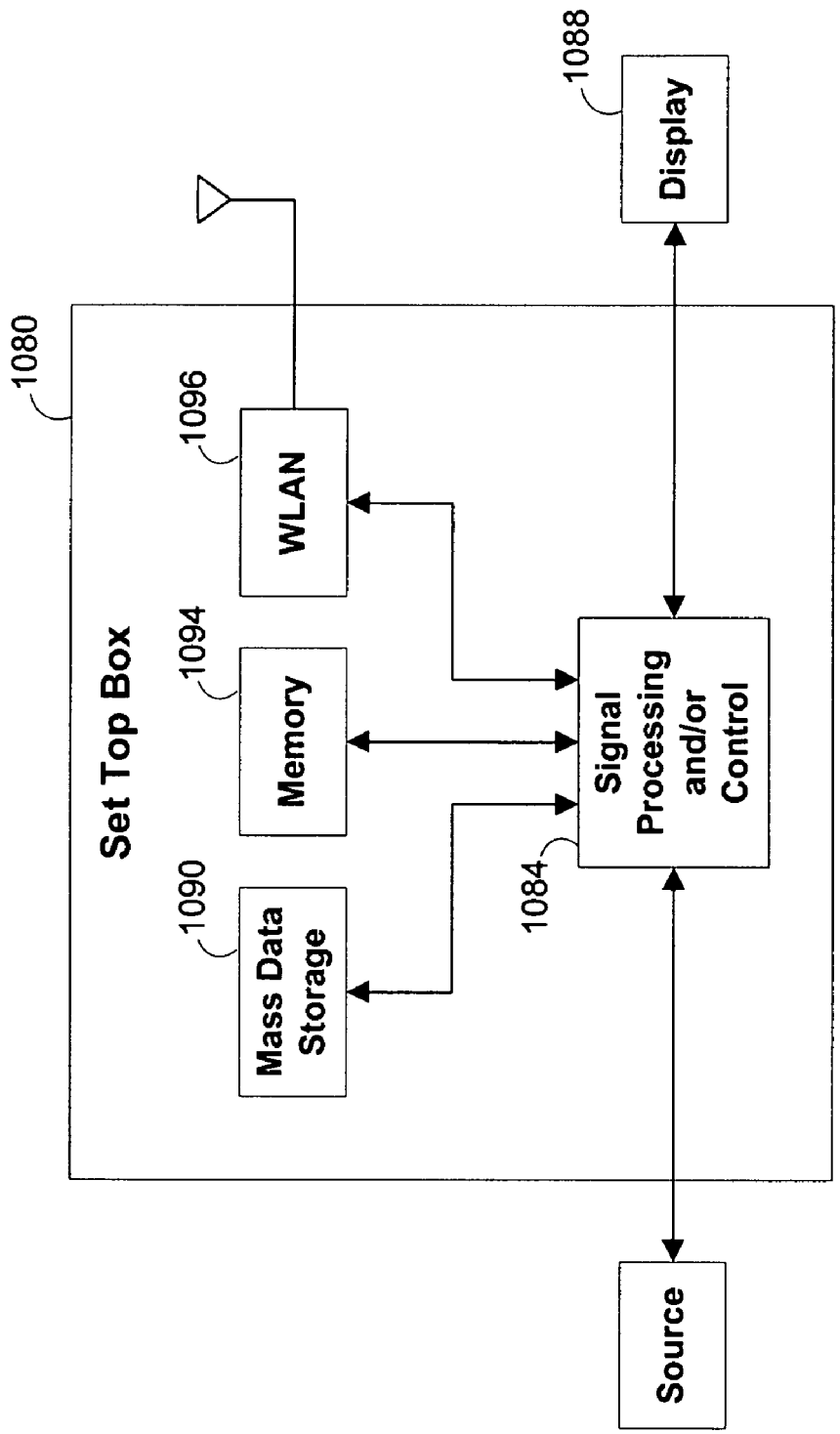
FIG. 8F is a block diagram of an exemplary set top box that can employ the disclosed technology.

Referring now to FIG. 8F, the present invention can be implemented in a set top box 1080. The present invention may implement either or both signal processing and/or control circuits, which are generally identified in FIG. 8F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 8G:
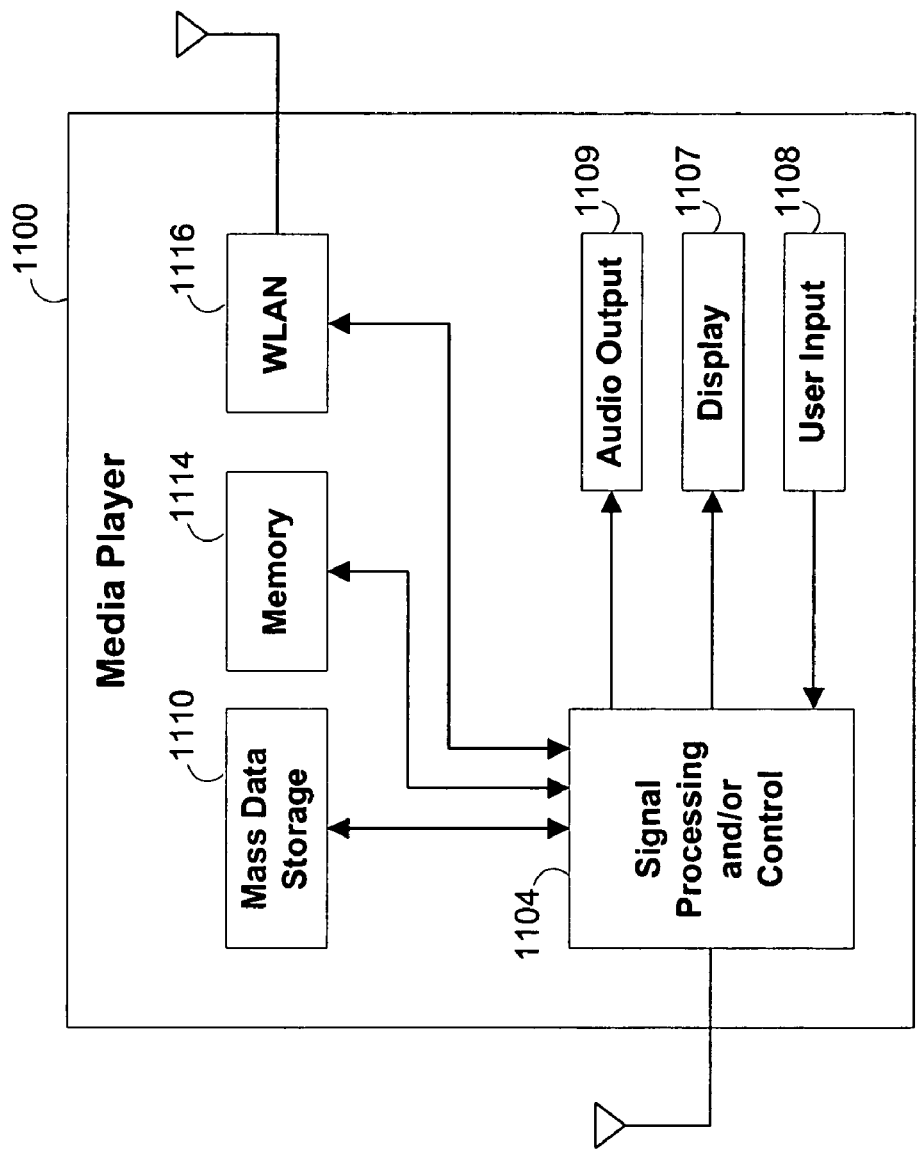
FIG. 8G is a block diagram of an exemplary media player that can employ the disclosed technology.

Referring now to FIG. 8G, the present invention can be implemented in a media player 1100. The present invention may implement either or both signal processing and/or control circuits, which are generally identified in FIG. 8G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Accordingly, what have been described thus far are systems and methods for encoding and decoding data based on a tensor product code. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed invention as defined by the following claims.

What is claimed is:

1. A method for recovering at least a portion of a stream of received data, wherein the received data is encoded based on a tensor product code (TPC) that includes an iterative code, the method comprising:
    detecting with a first detector the stream of received data to provide a stream of detected data, wherein the detected data corresponds to a codeword of the tensor product code;
    decoding with a TPC decoder the stream of detected data based on at least the iterative code to recover at least a portion of the stream of received data; and
    re-detecting with a second detector the at least a portion of the stream of received data to provide re-detected data, wherein the re-detected data corresponds to the codeword of the tensor product code.

2. The method of claim 1, wherein decoding the stream of detected data includes decoding based on the tensor product code.

3. The method of claim 1, wherein the iterative code is one of a turbo code and a low density parity check code.

4. The method of claim 3, wherein the turbo code includes two systematic convolutional codes.

5. The method of claim 3, wherein detecting the stream of received data includes providing the stream of detected data using one of a Viterbi detector, a soft output Viterbi algorithm (SOYA) detector, and a Bahl Cocke Jelinek Raviv (BCJR) detector.

6. The method of claim 1, wherein said decoding the stream of detected data is further based on an inner code, the decoding comprising:
    encoding the stream of detected data based on the inner code to provide encoded data, and
    decoding the encoded data using the iterative code to provide redundancy data, wherein the redundancy data corresponds to a codeword of the iterative code.

7. The method of claim 6, further comprising providing at least one reliability metric for the stream of detected data based on the stream of received data.

8. The method of claim 7, further comprising providing at least one reliability metric for the redundancy data based on the at least one reliability metric for the stream of detected data.

9. The method of claim 8, wherein the at least one reliability metric for the redundancy data includes at least one of likelihood information and log likelihood information.

10. The method of claim 1, wherein re-detecting the stream of received data comprises detecting the stream of received data based on a Viterbi detector and the redundancy data, wherein the redundancy data constrains outputs of the Viterbi detector.

11. The method of claim 1, further comprising:
    decoding the at least a portion of the stream of received data based on a second run length limited decoder to provide a first stream of data,
    including dummy bits in the first stream of data to provide a second stream of data,
    decoding the second stream of data based on an error correction code decoder to provide a third stream of data,
    removing the dummy bits from the third stream of data to provide a fourth stream of data, and
    decoding the fourth stream of data based on a first run length limited decoder.

12. A system for recovering at least a portion of a stream of received data, wherein the stream of received data is encoded based on a tensor product code (TPC) that includes an iterative code, the system comprising:
    a first detector that detects the stream of received data to provide a stream of detected data, wherein the detected data corresponds to a codeword of the tensor product code;
    a TPC decoder in communication with the detector, wherein the decoder decodes the stream of detected data based on at least the iterative code; and
    a second detector that re-detects the stream of decoded data to provide re-detected data, wherein the re-detected data corresponds to the codeword of the tensor product code.

13. The system of claim 12, wherein the iterative code is a low density parity check code, and wherein the TPC decoder comprises a low density parity check decoder corresponding to the low density parity check code.

14. The system of claim 12, wherein the iterative code is a Turbo code, and wherein the TPC decoder comprises a Turbo decoder corresponding to the Turbo code.

15. The system of claim 14, wherein the turbo decoder includes two systematic convolutional decoders.

16. The system of claim 12, wherein the first detector is one of a Viterbi detector, a soft output Viterbi algorithm (SOYA) detector, and a Bahl Cocke Jelinek Raviv (BCJR) detector.

17. The system of claim 12, wherein the TPC decoder comprises:
    an inner code encoder in communication with the detector, wherein the inner code encoder encodes the stream of detected data based on an inner code to provide encoded data; and
    an iterative decoder corresponding to the iterative code and in communication with the inner code encoder, wherein the iterative decoder decodes the encoded data using the iterative code to provide redundancy data, wherein the redundancy data corresponds to a codeword of the iterative code.

18. The system of claim 17, wherein the first detector comprises a first reliability metric generator that provides at least one reliability metric for the stream of detected data based on the stream of received data.

19. The system of claim 18, wherein the decoder comprises a second reliability metric generator that provides at least one reliability metric for the redundancy data based on the at least one reliability metric for the stream of detected data.

20. The system of claim 19, wherein the at least one reliability metric for the redundancy data includes at least one of likelihood information and log likelihood information.

21. The system of claim 17, wherein the second detector is a Viterbi detector, wherein the redundancy data constrains outputs of the Viterbi detector.

22. The system of claim 12, further comprising at least one of an error correcting decoder and a run length limited decoder, in communication with the decoder.

23. The system of claim 12, further comprising:
- a second run length limited decoder in communication with the TPC decoder that decodes the at least a portion of the stream of received data to provide a first stream of data,
- a dummy bit marker in communication with the second run length limited decoder that includes dummy bits in the first stream of data to provide a second stream of data,
- an error correction code decoder in communication with the zero marker that decodes the second stream of data to provide a third stream of data,
- a dummy bit remover in communication with the error correction decoder that removes the dummy bits from the third stream of data to provide a fourth stream of data, and
- a first run length limited decoder in communication with the dummy bit remover that decodes the fourth stream of data.

* * * * *